(12) United States Patent
Bakalski et al.

(10) Patent No.: US 9,270,248 B2
(45) Date of Patent: Feb. 23, 2016

(54) IMPEDANCE MATCHING NETWORK WITH IMPROVED QUALITY FACTOR AND METHOD FOR MATCHING AN IMPEDANCE

(71) Applicant: Infineon Technologies AG, Neubiberg (DE)

(72) Inventors: Winfried Bakalski, Munich (DE); Anthony Thomas, Munich (DE)

(73) Assignee: Infineon Technologies AG, Neubiberg (DE)

( * ) Notice: Subject to any disclaimer, the term of this patent is extended or adjusted under 35 U.S.C. 154(b) by 474 days.

(21) Appl. No.: 13/651,174

(22) Filed: Oct. 12, 2012

(65) Prior Publication Data

US 2014/0104132 A1   Apr. 17, 2014

(51) Int. Cl.
| | |
|---|---|
| *H03H 7/38* | (2006.01) |
| *H01Q 1/50* | (2006.01) |
| *H01L 29/417* | (2006.01) |
| *H01L 29/423* | (2006.01) |
| *H01L 23/66* | (2006.01) |
| *H01L 27/06* | (2006.01) |
| *H01L 27/08* | (2006.01) |
| *H04B 1/18* | (2006.01) |
| *H04B 1/04* | (2006.01) |
| *H01L 27/12* | (2006.01) |

(52) U.S. Cl.
CPC ............... *H03H 7/38* (2013.01); *H01L 23/66* (2013.01); *H01L 27/0641* (2013.01); *H01L 27/08* (2013.01); *H01L 27/0808* (2013.01); *H01L 29/41733* (2013.01); *H01L 29/42384* (2013.01); *H01L 27/1203* (2013.01); *H01L 2924/0002* (2013.01); *H04B 1/0458* (2013.01); *H04B 1/18* (2013.01)

(58) Field of Classification Search
CPC .......... H03H 7/38; H04B 1/0458; H04B 1/18; H01L 27/08
USPC .......................................................... 333/32
See application file for complete search history.

(56) References Cited

U.S. PATENT DOCUMENTS 6,127,908 A * 10/2000 Bozler et al. ................... 333/246
7,259,643 B2 * 8/2007 Son et al. ....................... 333/174

(Continued)

FOREIGN PATENT DOCUMENTS

DE      10 2005 058 875 A1    6/2007

*Primary Examiner* — Stephen E Jones
*Assistant Examiner* — Scott S Outten
(74) *Attorney, Agent, or Firm* — Slater & Matsil, L.L.P.

(57) ABSTRACT

An impedance matching network comprises a first and a second signal terminal and a reference potential terminal. The network further comprises a first shunt branch between the first signal terminal and the reference potential terminal, the first shunt branch comprising a variable inductive element and a first capacitive element. The impedance matching network also comprises a second shunt branch between the second signal terminal and the reference potential terminal and comprising a second capacitive element. A series branch between the first signal terminal and the second signal terminal comprises a third capacitive element. Optionally, the first, second, and/or third capacitive element may be implemented as a variable capacitive element. The variable capacitive element comprises a plurality of transistors, wherein a combination of off-capacitances $C_{off}$ of the transistors provide an overall capacitance of the variable capacitive element as a function of at least two independent transistor control signals.

18 Claims, 33 Drawing Sheets

(56) References Cited

U.S. PATENT DOCUMENTS

| | | |
|---|---|---|
| 7,831,219 B2 | 11/2010 | Heuermann et al. |
| 8,164,387 B1 | 4/2012 | Apel et al. |
| 2005/0237127 A1* | 10/2005 | Van Delden ................ 333/105 |
| 2010/0085129 A1 | 4/2010 | Shuto et al. |
| 2011/0075449 A1 | 3/2011 | Fouquet |
| 2012/0214421 A1 | 8/2012 | Hoirup et al. |
| 2013/0021113 A1* | 1/2013 | Bakalski et al. ............. 333/176 |

* cited by examiner a) b) c) d) e)

f) g) h) i) j)

PRIOR ART

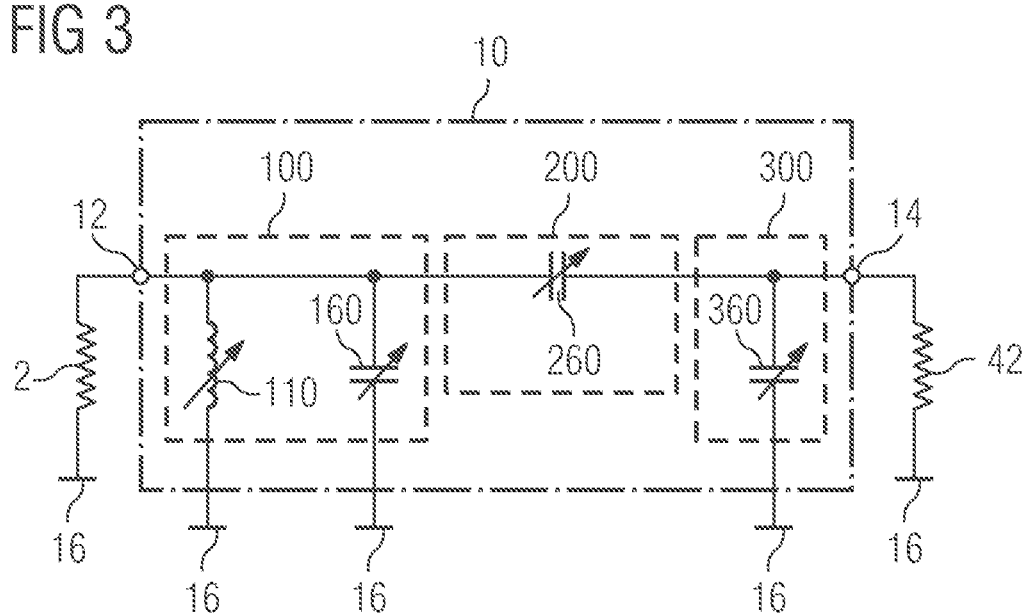
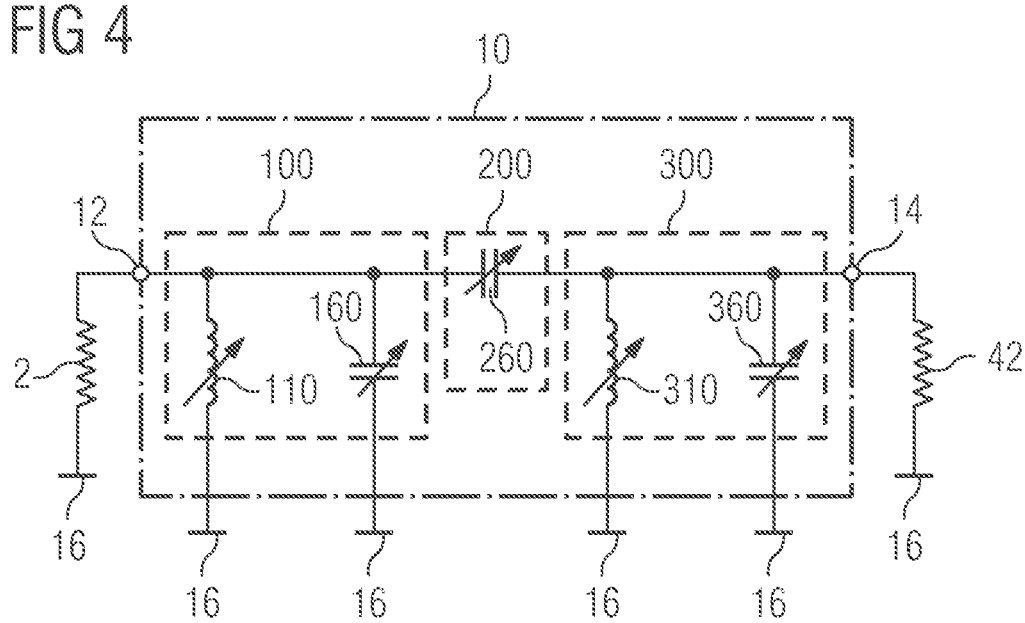

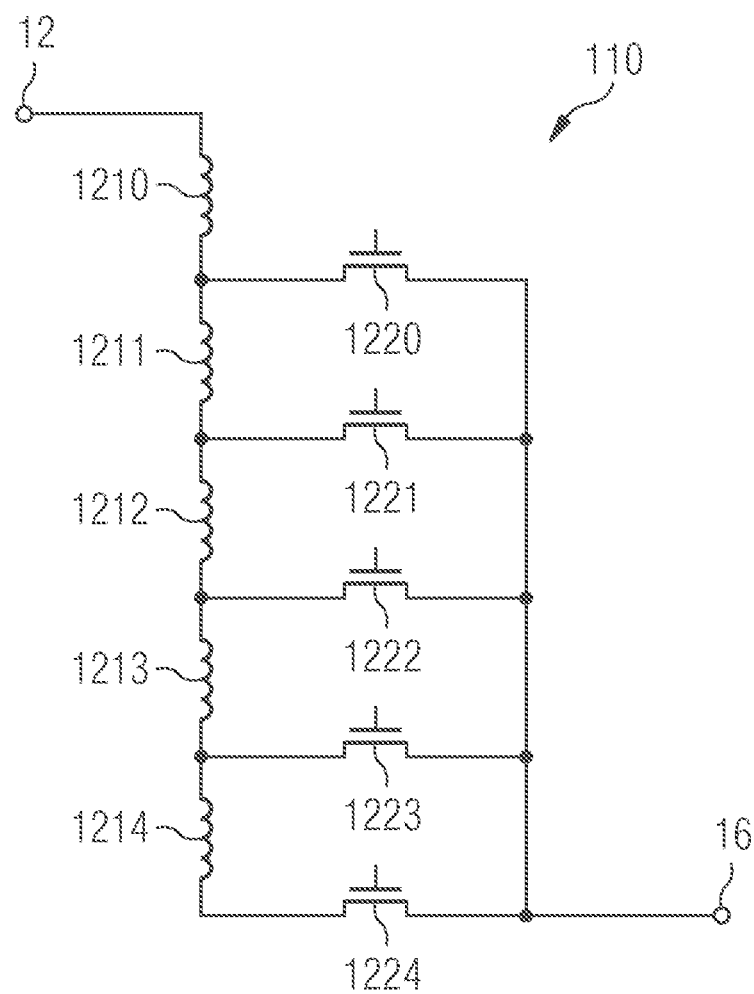

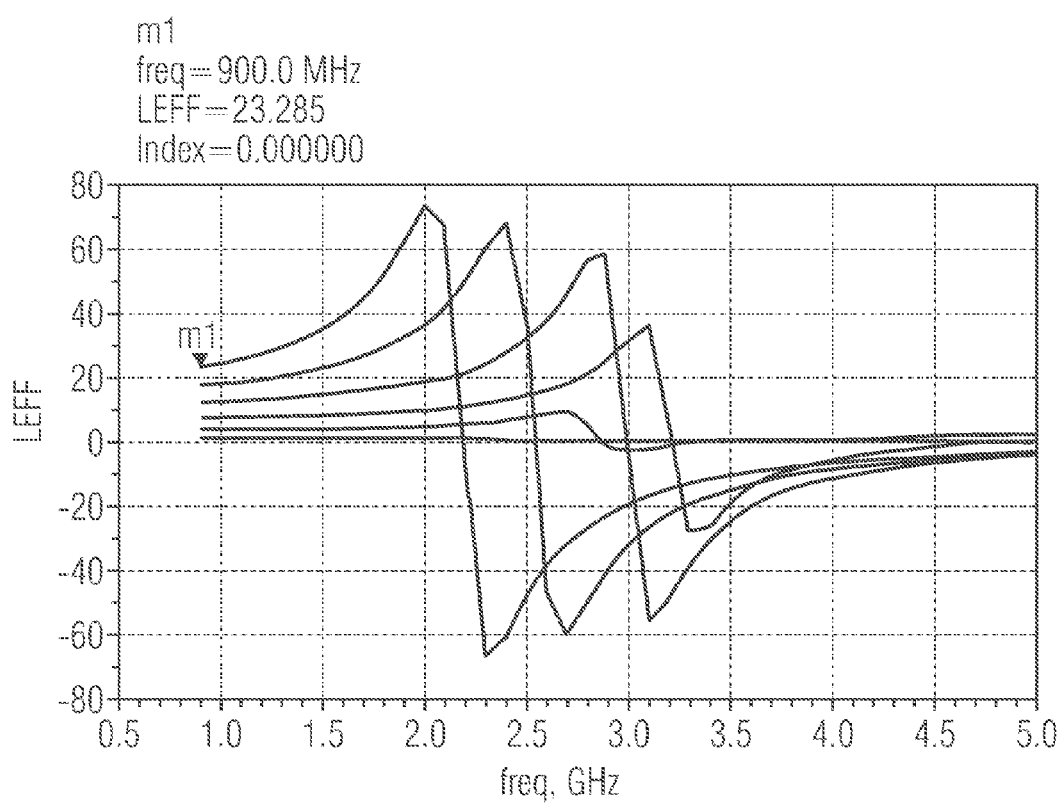

PARALLEL L:

SERIES L:

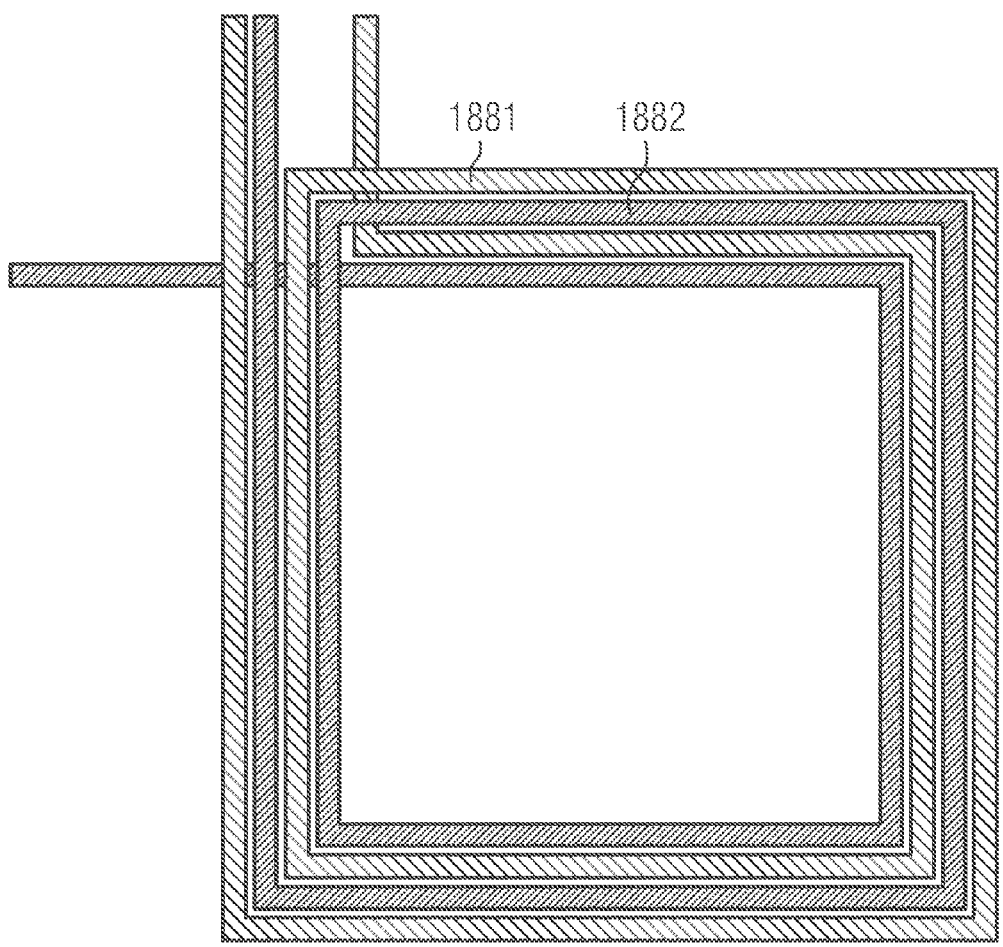

FIG 21
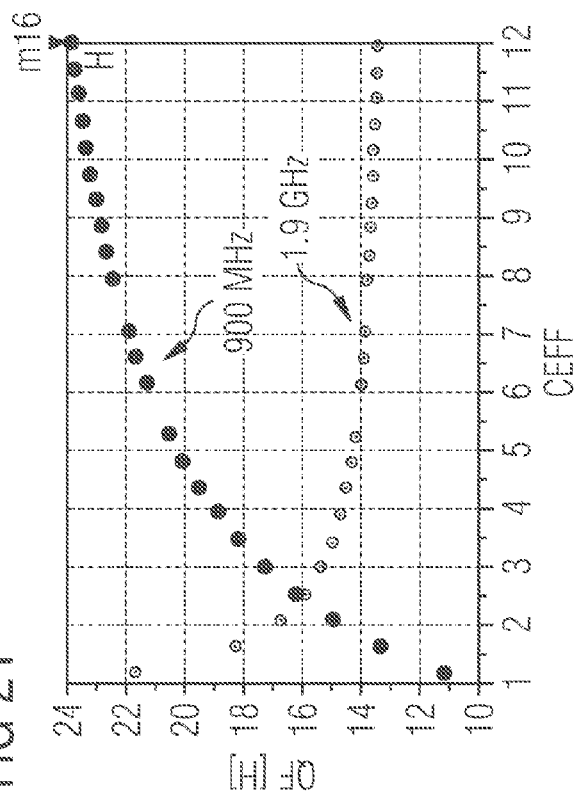
FIG 22
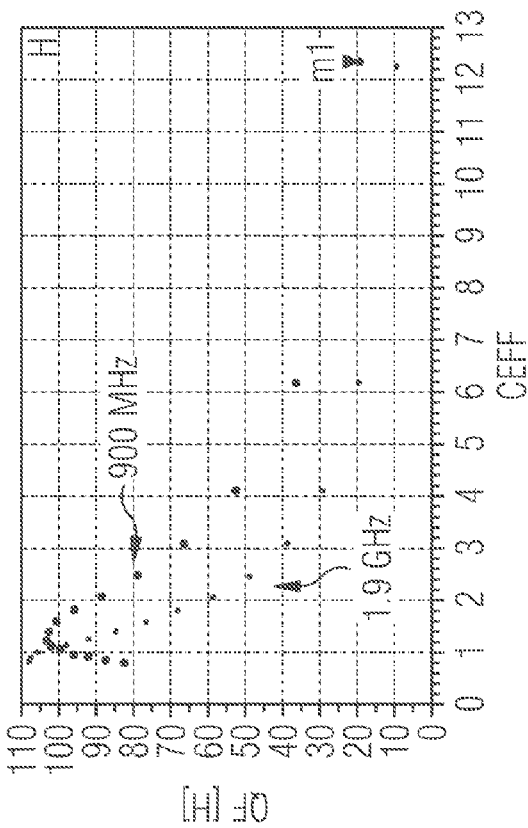
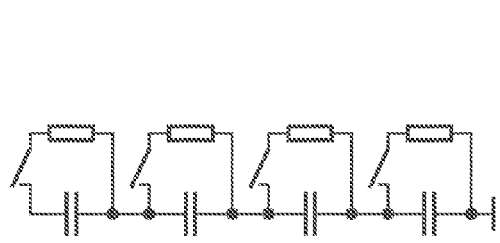
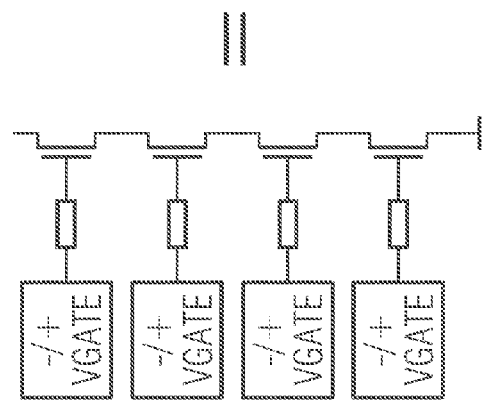
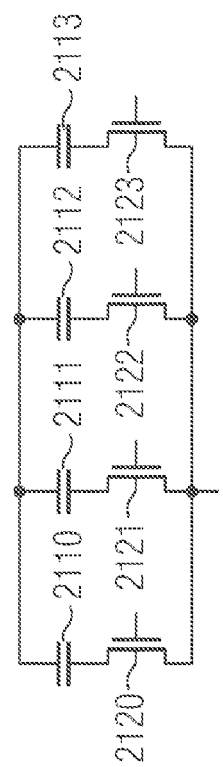

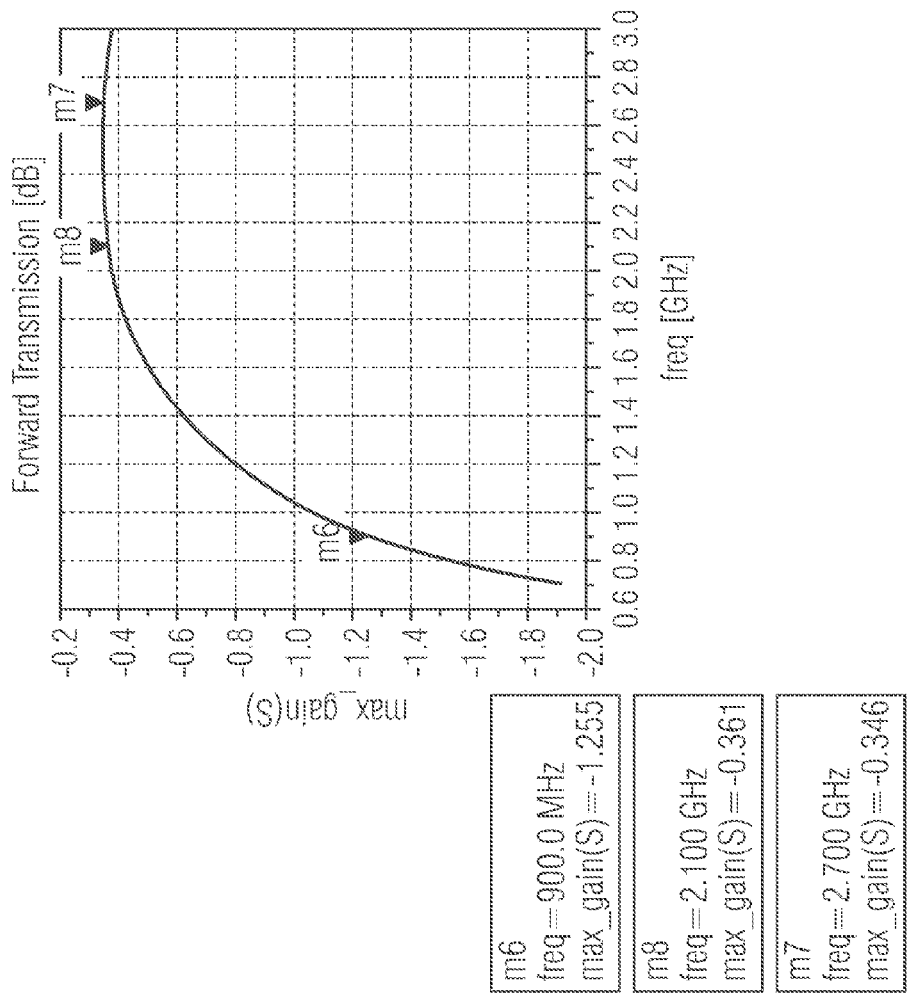
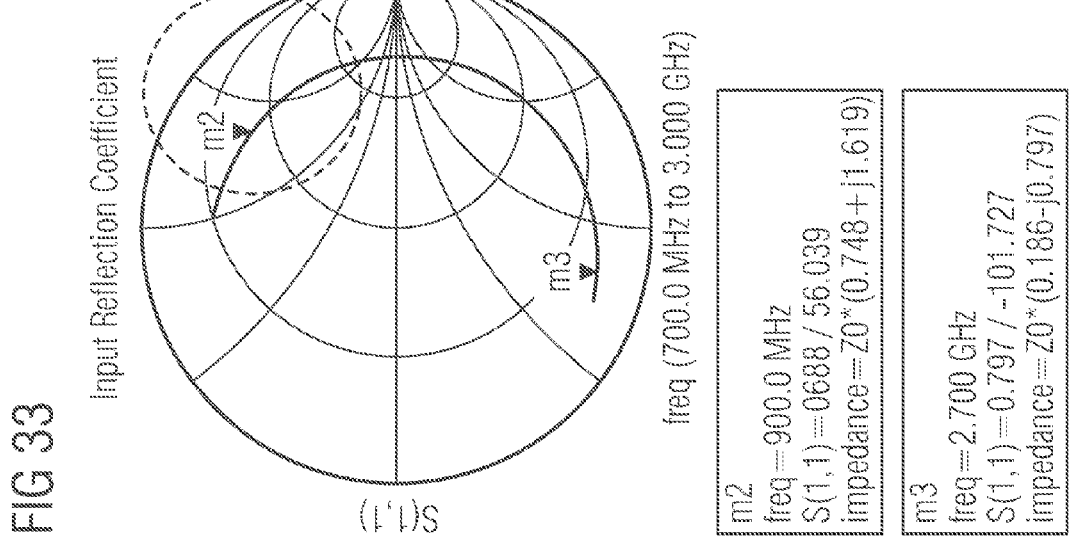
FIG 33

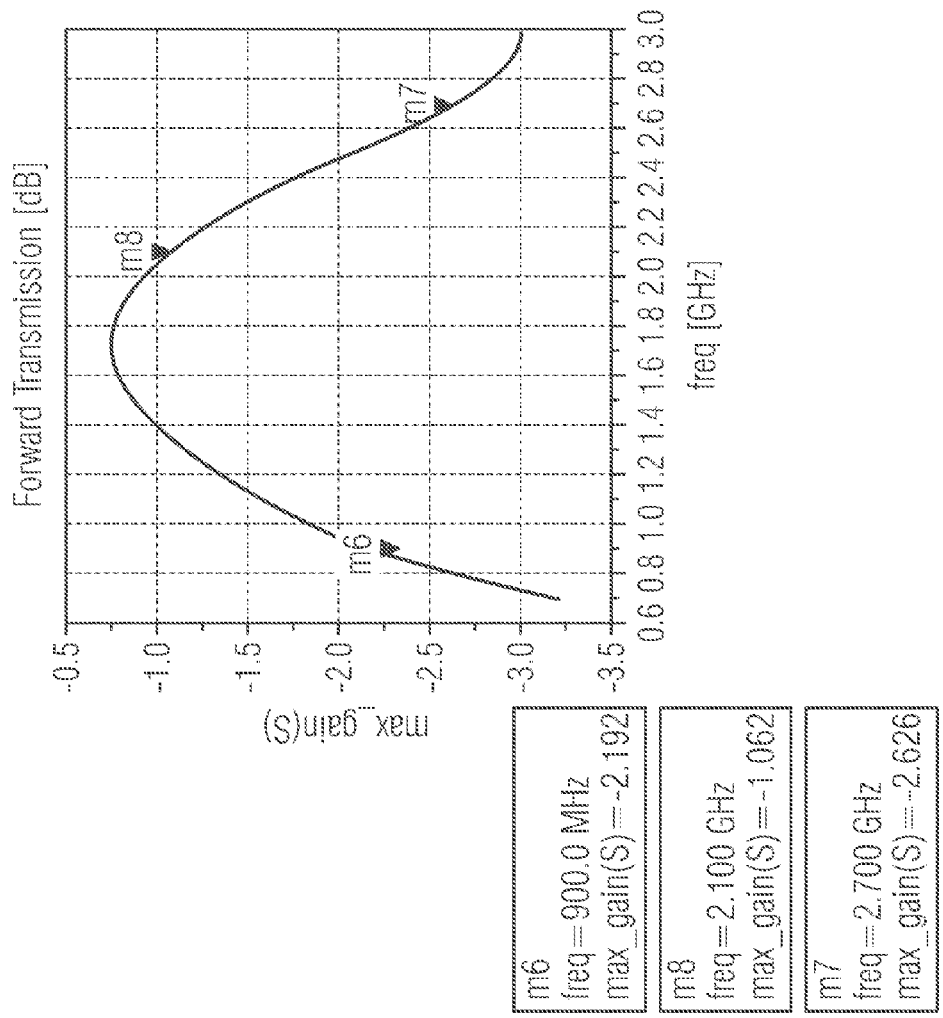
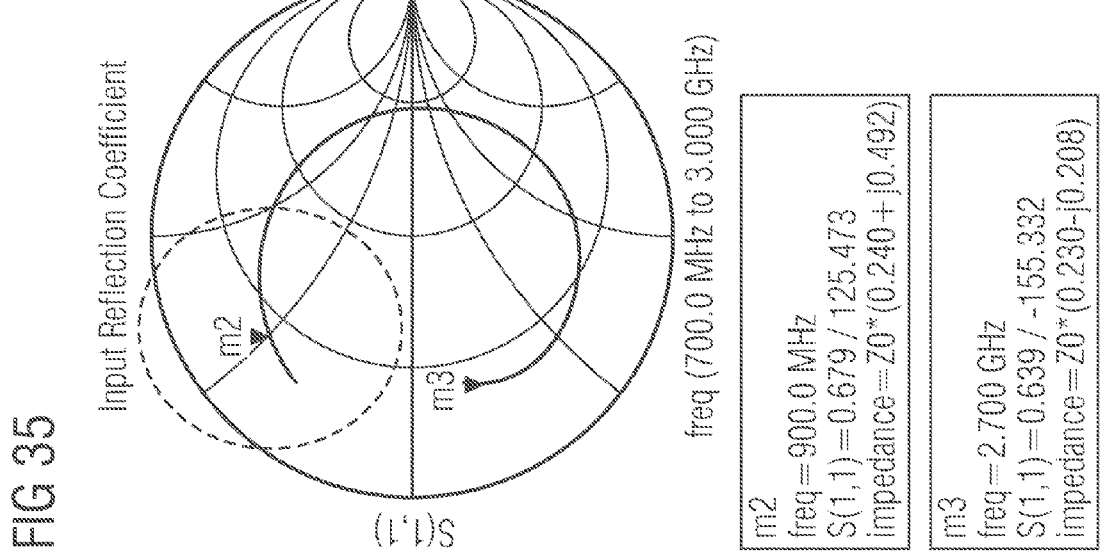
FIG 35

_US 9,270,248 B2_

IMPEDANCE MATCHING NETWORK WITH IMPROVED QUALITY FACTOR AND METHOD FOR MATCHING AN IMPEDANCE

TECHNICAL FIELD

Embodiments of the present invention relate to an impedance matching network that may be provided between a source of electrical power and a consumer of electrical power. Embodiments of the present invention relate to an antenna circuit comprising an impedance matching network. Embodiments of the present invention relate to a method for matching an impedance. Further embodiments of the present invention relate to a switch transistor-based matching network.

BACKGROUND

In electrical or electronic systems, it is often desirable to design the input impedance of an electrical load (or the output impedance of a source of electrical energy) to maximize the power transfer and/or minimize reflections from the load. Maximum power transfer is typically obtained when the load impedance is equal to the complex conjugate of the source impedance. In contrast, minimum reflection can typically be achieved when the load impedance is equal to the source impedance.

Current radio frequency (RF) or high-frequency (HF) front end systems typically still comprise, at the transmitter end, a power amplifier (PA) for amplifying the signal to the required level, a filter (typically a harmonic filter), a power detector, and an antenna switch that performs a switching between the transmission bands, the reception bands, as well as between transmitter operation and receiver operation. Thereafter the signal is typically forwarded via an antenna impedance matching network to the antenna.

This antenna impedance matching is designed that, averaged over all use cases, frequencies and operating modes, as well as over their respective probabilities, an optimum is achieved. As can readily be seen, the optimum is only reached very seldom, because the frequency spectrum of the mobile communications frequencies constantly becomes broader and also the antenna itself provides very different matching for all frequencies and environmental conditions that may occur.

Moreover, in order to address all possible matching points, an inductive matching component as well as a capacitive matching component is needed. In order to reach all regions of the Smith chart, typically at least three components are needed. Due to the fact that combinations exist which would lead to very unfavorable component values, typically up to six reactive components are employed in order to obtain more flexibility. But also these matching networks may suffer from the fact that they achieve a high quality factor for only a selected choice of the component values and/or at a specific frequency. When the impedance matching network is set to another operating point, a significant degradation of quality factor can typically be observed.

SUMMARY OF THE INVENTION

Embodiments of the present invention provide an impedance matching network comprising a first signal terminal, a second signal terminal, and a reference potential terminal. The impedance matching network further comprises a first shunt branch between the first signal terminal and the reference potential terminal. The first shunt branch comprises a variable inductive element and a first capacitive element. The impedance matching network also comprises a second shunt branch between the second signal terminal and the reference potential terminal. The second shunt branch comprises a second capacitive element. The impedance matching network further comprises a series branch between the first signal terminal and the second signal terminal. The series branch comprises a third capacitive component.

Further embodiments of the present invention provide an impedance matching network comprising a variable capacitive element. The variable capacitive element comprises a plurality of transistors, wherein a combination of off-capacitances $C_{off}$ of the transistors provide an overall capacitance of the variable capacitive element as a function of at least two independent transistor control signals.

Furthermore, embodiments of the present invention provide an antenna circuit comprising an antenna, a signal terminal, and an impedance matching network. The signal terminal is configured to relay a signal to a receiver or from a transmitter. The impedance matching network interconnects the antenna and the signal terminal and comprises a variable inductive element within a shunt branch.

Further embodiments of the present invention provide a method for matching an impedance, the method comprising: determining or estimating a source impedance of a signal source, and determining or estimating a sink impedance of a signal sink. The method further comprises adjusting an impedance matching network on the basis of the source impedance and the sink impedance by adjusting a variable inductive element within a shunt branch of the impedance matching network.

Furthermore, embodiments of the present invention provide a method for matching an impedance, the method comprising determining or estimating a source impedance of a signal source. The method also comprises determining or estimating a sink impedance of a signal sink. Furthermore, the method comprises adjusting an impedance matching network on the basis of the source impedance and the sink impedance by adjusting a variable capacitive element that is part of the impedance matching network. The variable capacitive element comprises a plurality of transistors, wherein a combination of off-capacitances $C_{off}$ of the transistors provide an overall capacitance of the variable capacitive element.

BRIEF DESCRIPTION OF THE DRAWINGS

Embodiments of the present invention are described herein, making reference to the appended drawings.

FIG. 3 shows a schematic circuit diagram of an impedance matching network according to embodiments having a variable inductive component within a first shunt branch;

FIG. 4 shows a schematic circuit diagram of an impedance matching network having a first variable inductive component in the first shunt branch and a second variable inductive component in a second shunt branch;

FIG. 12A shows a schematic circuit diagram of another possible implementation of the variable inductive element;

FIG. 12D is a graph of the effective inductance over frequency of the variable inductive element in FIG. 12C;

FIG. 18H shows a schematic plan view of a possible arrangement of the two inductors of the variable inductive element shown in FIG. 18A;

FIG. 21 illustrates the quality factor versus effective capacity of a variable capacitive element at two different frequencies, as well as the corresponding schematic circuit diagram of the variable capacitive element;

FIG. 22 illustrates the quality factor versus effective capacity of another variable capacitive element at two different frequencies, as well as schematic circuit diagram for the variable capacitive element;

FIGS. 32 to 37 show several example cases for impedance matching with respect to different impedance values, in the form of a Smith chart and a curve of the forward transmission versus frequency;

Equal or equivalent elements or elements with equal or equivalent functionality are denoted in the following description by equal or similar reference numerals.

DETAILED DESCRIPTION OF ILLUSTRATIVE EMBODIMENTS

Figure 1:
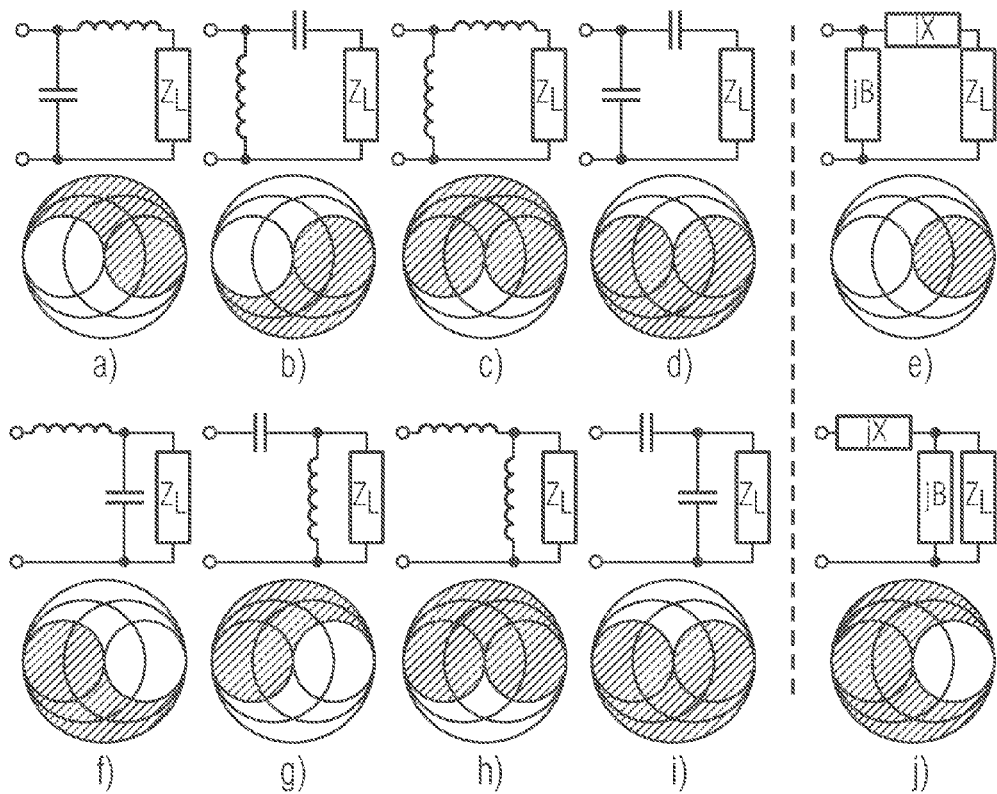
FIG. 1 illustrates a plurality of basic LC networks and their corresponding "forbidden regions" in the Smith chart plane.

In the following description, a plurality of details are set forth to provide a more thorough explanation of the embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

In wireless communications systems for the radiofrequency (RF), the high-frequency (HF), or other frequency ranges, a so-called front end system may be provided. Such a front end system may be part of a mobile station (e.g., cell phone, smartphone, tablet computer, USB modem) or a base station (e.g., base transceiver station BTS) of a mobile communications network. The front end system may typically comprise a transceiver, a power amplifier, a harmonic filter, an antenna switch, an antenna matching network, and an antenna. When functioning in a transmitter operating mode, the transceiver may provide a transmit signal at its output to the power amplifier. An amplified transmit signal provided by the power amplifier is connected to the harmonic filter, which reduces frequency components of the amplified transmit signal outside an intended transmit frequency range. An output of the harmonic filter is connected to one of the plurality of inputs of the antenna switch. The antenna switch may be currently configured to connect said input to an antenna switch output. The other inputs of the antenna switch may be connected to respective outputs of further harmonic filters having a different frequency response than the harmonic filter that is currently used. In this manner the RF or HF frontend system may be configured to support several transmit frequencies and/or several mobile communications standards. The antenna switch is further configured to connect the antenna matching network with an RX input (i.e., a receiver input) of the transceiver via a connection, wherein the HF or RF frontend system operates in a receiver mode.

The antenna switch output may be connected to an input of the antenna matching network. The antenna matching network may be implemented as a basic LC network comprising a series inductance and a capacitance connected in parallel to an output of the antenna matching network. The output of the antenna matching network is connected to the antenna.

As the HF frontend system can be configured by means of the antenna switch to support several frequencies, mobile communications standards, and/or other parameters related to the transmission or reception of radio signals, the antenna matching network has to be selected taking into account the various possible use cases, frequencies, and operating modes, as well as their respective probabilities in order to provide a weighted optimum. This task becomes more and more difficult, because the frequency spectrum of the mobile communications frequencies is getting wider and wider, and also the antenna itself requires different impedance matching settings for different environmental conditions. In addition, the problem of antenna mismatch due to the different environment of the antenna has to be considered. For example, the impedance of an antenna may vary very strongly when the antenna is being touched by, e.g., a finger of a mobile phone user, as could be observed with some mobile phone models sold in the past. Moreover, a mismatch leads to additional non-linearity at the power amplifier and to a modification of the filter behavior of the harmonic filter, because the mismatch is passed through the antenna switch. In consequence, the overall system is negatively affected at several points by the mismatch. These problems are more exactly considered only recently, because for a long time mobile communications systems only used to be specified for 50 ohms measuring systems.

For some time past, additional requirements with respect to the total radiated power (TRP) exist, which have to be fulfilled by mobile communications devices for specific network providers. This means that for a wide range of mismatches the system has to reach the required radiated power. With respect to the impedance matching network, it has to be considered that with a given impedance matching network topology not every impedance may be realized, i.e., there are so-called "forbidden regions." FIG. 1 illustrates some basic LC networks, L-only networks, or C-only networks. Below each basic network a corresponding schematic Smith chart is illustrated in which the forbidden region is represented as a hatched region. A load impedance $Z_L$ is connected to the various basic networks.

In order to cover a wide range of possible impedances, adjustable impedance matching networks typically have a PI-topology or a T-topology. A PI-topology having a series inductance, a parallel input capacitance, and a parallel output capacitance forms a low pass filter which attenuates harmonics generation. Furthermore, variable capacitances are available (rotary capacitor, BSR capacitor i.e., (BaSr)RuO3 capacity, micro-electromechanical system (MEMS) capacity, ...), whereas a variable inductance typically requires a variable tap.

For the application "adaptive matching circuits," such as for example antenna matching or matching of power amplifiers, a number of topologies exist that differ from each other with respect to the impedance region that can't be matched ("forbidden region"), the frequency behavior, and loss mechanisms. In FIG. 1, case e) has the smallest forbidden region. However, this is only possible if the impedance was $J_B$ and $J_X$ can be independently controlled to have an inductive behavior for a capacitive behavior over a very large range. Indeed, in order to be able to address all possible matching points, an inductive as well as a capacitive matching element typically is necessary. In order to reach all regions of the Smith chart, at least three elements are needed. However, there may be combinations that may lead to very unfavorable component values so that up to six reactive elements may be used in order to achieve more flexibility.

Antenna matching typically involves matching the $S_{11}$ parameter of the antenna to 50 ohm or to another desired impedance value. A different approach is antenna tuning, wherein the antenna characteristics are changed by modifying the feedpoint of the antenna, the reflector, etc. Antenna tuning possibly may lead to a higher antenna efficiency. Antenna tuning typically also is beneficial for better out-of-band suppression of external jammers. Another benefit of antenna tuning is that the tuning element does not see transmission line losses. On the other hand, sensing the radiated power may not be as straight forwards anymore (e.g., extra receiver path). Device stress can be very high (high RF voltages, ESD). In particular, the stress can be higher than in antenna matching (due to losses). The tuning element is part of the antenna, thus it is not necessarily at the same physical location as the antenna switch (a single-chip/single-module solution may not always be possible). Furthermore, antenna tuning may worsen harmonics and IMD (intermodulation distortion) performance.

Referring back to antenna matching, when properly done, antenna matching typically results in better linearity due to less mismatch at the power amplifier. The current consumption of the power amplifier typically is lower, as well. However, the efficiency is typically lower than with antenna tuning. Antenna matching may offer an additional filter function (matching=filtering). Furthermore, an integration with the main antenna switch as a single chip/single module is typically possible. However, antenna matching may involve the following drawbacks. Antenna matching does not address the antenna characteristic itself so that the system can still operate in an inefficient manner. Antenna matching typically causes insertion losses, even in the 50 ohm matching case. Typically, the insertion losses are >0.5 dB. The device can worsen the harmonics performance (especially with varactor-device approaches due to their voltage dependent capacitance nature in combination with high RF voltages).

The RF switch or antenna switch may be regarded as a possible enabler, e.g., for wireless multiband or broadband communication devices.

Figure 2:
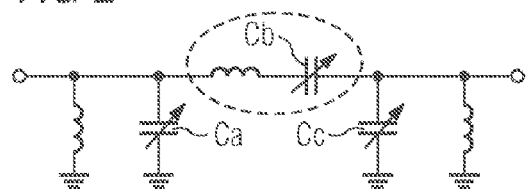
FIG. 2 shows a schematic circuit diagram of an impedance matching network with Pi-topology comprising three fixed value inductive components and three variable capacitive components.

FIG. 2 shows a schematic circuit diagram of a PI matching network. The capacitances Ca, Cb, and Cc are variable. The three conductances of the impedance matching network in FIG. 2 may typically have a high quality factor. In particular, at least one of the three inductances may be in a SMD (surface mount device) package format (e.g., placed in a Laminate module or embedded in a LTCC carrier). Such inductive elements may have a maximal quality factor of 80 (Qmax=80). The choice of variable capacitances but fixed inductive elements may typically be due to technology-related reasons (BST (Barium Strontium Titanate) capacitances for example are a variable capacity in a circuit-technology-related sense that are controllable using a bias voltage. However, they do not provide a true switch function or commutation function. Similar observations can be made with respect to most of the micro-electromechanical system processes (MEMS processes) which provide adjustable capacity but not necessarily have a true galvanic connection. RF MEMS and BST capacitances are typically expensive and bulky solutions, some even require an add-on controller chip. Available MEMS are usually not galvanic switches but are used as a tuner. This means that the capacitance can be changed, e.g., between 1 pF and 10 pF, but the device cannot provide a low-ohmic conducting connection (i.e., no "C∞"). Bypass switching or inductor switching may not be directly possible. Bypass is typically the $C_{max}$ value (e.g., 20 pF in series).

Furthermore, the quality factors cannot be identical for all C/L values to which the device is tuned. A maximal quality factor Qmax will be dependent on frequency and also on the momentarily selected capacitance value. The reason is that the quality factor is Q=Im(Z)/Re(Z). The impedance Z is approximately proportional to the capacitance, i.e., Z~C, but the resistance R typically remains the same (due to the physical dimensions).

The impedance matching network shown in FIG. 2 comprises a series branch which is indicated by the oval drawn in dashed line in FIG. 2. Taking the series inductive element as an example, the inductance value typically must take into account the highest needed value. In case smaller inductance values are needed, the capacity $C_B$ may be used to reduce the inductance of the series branch. However, this typically (or sometimes even inevitably) leads to a loss of quality factor, because the imaginary part is made smaller, whereas the series resistance remains at least constant (Q=|Im(Z)/Re(Z)|). The same is also true for the parallel circuits in the shunt branches with the capacitances Ca and Cc. The permanent presence of an (unnecessarily) high series resistance also manifests itself in an insertion loss. As a rule of thumb one may assume for the frequencies in a 50 ohm system that for every 1 ohm of series resistance ~0.1 dB of insertion loss has to be expected.

One approach might be the use of a switch and hence the adjustment of the inductivity itself, instead of counteracting with a capacitance. Moreover, it can be seen from the estimation of 1 ohm series resistance leading to approximately 0.1 dB insertion loss that the series portion of ohmic resistance should be kept minimal. For this reason, a component should be employed that exhibits very high quality factors and in addition a very small series resistance. However, the best inductive elements in SMD package have a maximal quality factor of approximately 80. In reality, the quality factor is typically lower due to cost reasons and deviating frequency (for example, the maximal quality factor Qmax may be reached at 2 GHz, however the operating frequency is unfortunately at 800 MHz). For these reasons, the quality factor typically is in the range of 20, at best. The quality factor may be even as low as under 10, in particular for on-chip inductive elements with thin metal windings/traces. In contrast to inductive elements, capacitive elements typically have relatively high quality factors. For example, an on-chip capacity (e.g., MIM capacity=metal-insulator-metal capacity) typically exhibits a quality factor of over 100. A capacitive element in the form of a SMD component may even have a higher quality factor. For these reasons, a PI-topology that is based on the cases d) and i) in FIG. 1 appears to be promising.

When studying the cases d) and i) in FIG. 1 it can be seen that with a PI-circuit comprising capacitances only, a large region of the Smith chart can already be attained and hence adjusted. In order to be able to address the remaining impedances, an inductive element is needed in addition. It appears reasonable that this inductive element is an inductance against mass (e.g., within a shunt branch). At least some reasons for an inductive element against mass or ground are described now.

A shunt inductor protects the device against ESD pulses in a very efficient manner. This efficiency is based on the fact that the protection measure does not need any non-linear diodes (which could lead to the generation of harmonics).

The shunt inductor compensates, when selected appropriately, the off-capacitance $C_{off}$ of the capacity bank. Each adjustable capacity typically has a minimal value, and the capacitance of the adjustable capacity cannot be adjusted beneath this minimal value. Typically, this applies equally to capacitors that are based on MEMS, pHEMT, CMOS-NFET, or other technologies. In particular, a source-drain capacity of a transistor may always provide a residual capacitance. The corresponding value may be very small, but nevertheless parasitical. However, with a large inductance it can be compensated in a very low-loss manner (for example 18 nH at 900 MHz).

The inductive element can be implemented so that it is switchable, in which case losses become noticeable for imaginary parts, only. In the matching case 50 ohm to 50 ohm, the inductive element is not active and hence does not generate any losses.

FIG. 3 shows a schematic circuit diagram of an (adjustable) impedance matching network 10. The impedance matching network 10 comprises a first signal terminal 12, a second signal terminal 14, and a reference potential terminal 16. In the embodiment schematically illustrated in FIG. 3, the reference potential corresponds to the mass potential or ground potential of the circuit. A source impedance 2 is connected to the first signal terminal 12 of the impedance matching network 10. Although schematically depicted as an ohmic resistance, the source impedance 2 could also be a reactive impedance such as a capacity or an inductance, or a complex impedance having a real part and an imaginary part. At the other side of the impedance matching network 10, a sink impedance 42 is connected to the second signal terminal 14. The sink impedance 42 may also be an ohmic resistance (as illustrated), a capacitive impedance, an inductive impedance, or a complex impedance. Typically, a voltage source or a current source is also connected to the first signal terminal 12 or to the second signal terminal 14. In order to provide an application example, the source impedance 2 may be the output impedance of a power amplifier or of an harmonic filter in a frontend system used for RF or HF wireless communication. The sink impedance 42 may be an input impedance of an antenna.

The impedance matching network 10 comprises a first shunt branch 100 which extends between the first signal terminal 12 and the reference potential terminal 16. The first shunt branch 100 comprises a variable inductive element 110 and a first capacitive element 160. In other embodiments, the first capacitive element 160 may have a fixed or pre-determined or constant value.

The impedance matching network 10 further comprises a second shunt branch 300 between the second signal terminal 14 and the reference potential terminal 16. The second shunt branch 300 comprises a second capacitive element 360 which may be an adjustable or variable capacitance element (as shown in FIG. 3) or a capacitive element with a constant capacitance.

The impedance matching network further comprises a series branch 200 between the first signal terminal 12 and the second signal terminal 14. The series branch 200 comprises a first capacitive element 260 which may be adjustable or of fixed value according to various possible embodiments.

The impedance matching network according to the embodiment illustrated in FIG. 3 comprises three variable capacitance elements 160, 260, 360. Furthermore, the impedance matching network 10 comprises one variable inductive element 110.

The impedance matching network 10 schematically illustrated in FIG. 3 may be used for a lumped element match focused on high Q (quality factor) elements. The impedance matching network 10 avoids a series inductance (i.e., an inductance in the series branch 200) in order to reduce ohmic losses. Instead, only the shunt inductor or inductors are tuned. Optionally, the capacitor bank or capacitor banks may be implemented as several series-connected or parallel-connected transistors, wherein the off-capacitance $C_{off}$ of the transistors serve as the actual capacitances for the variable capacitor bank. As illustrated in FIG. 3, only one shunt inductor 110 is required in order to be able to address or attain (almost) every region of the Smith chart. As will be explained below, the bypass function may be implemented using one or more switches (e.g., transistors). The impedance matching network 10 according to the embodiment of FIG. 3 may be regarded as a combination of the basic networks d), g), and i) in FIG. 1.

FIG. 4 shows a schematic circuit diagram of the impedance matching network 10 according to a further embodiment having two variable inductive elements, one in each shunt branch 100, 300. The impedance matching network 10 in FIG. 4 may be regarded as a combination of the basic networks b), d), g), and i) in FIG. 1. In order to obtain a circuit that is symmetric from both sides, and also in order to obtain on ESD protection (electrostatic discharge protection), the impedance matching network 10 of FIG. 4 comprises an inductive element at each side, more precisely in each of the first shunt branch 100 and the second shunt branch 300.

Figure 5:
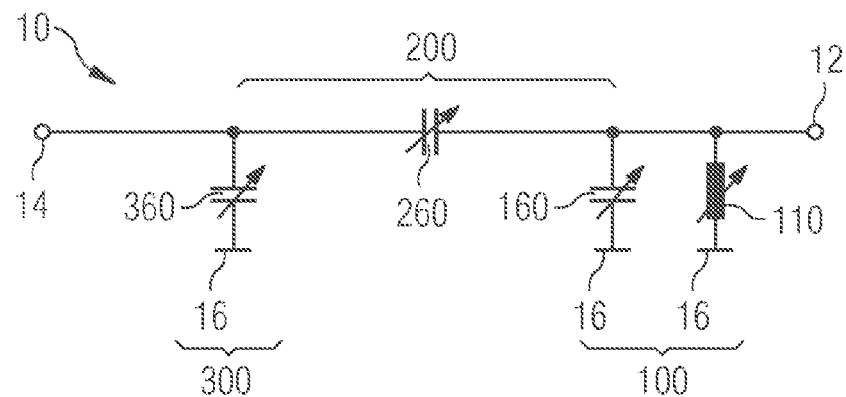
FIG. 5 shows a schematic circuit diagram of impedance matching network according to further embodiments having a variable inductive component in the second shunt branch.

FIG. 5 shows a schematic circuit diagram of the impedance matching network 10 according to another embodiment in which only the variable inductive 110 is present within the shunt branch that is connected in parallel to the load or sink. Accordingly, the first shunt branch 100 is the left shunt branch of the impedance matching network 10 shown in FIG. 5.

Figure 6:
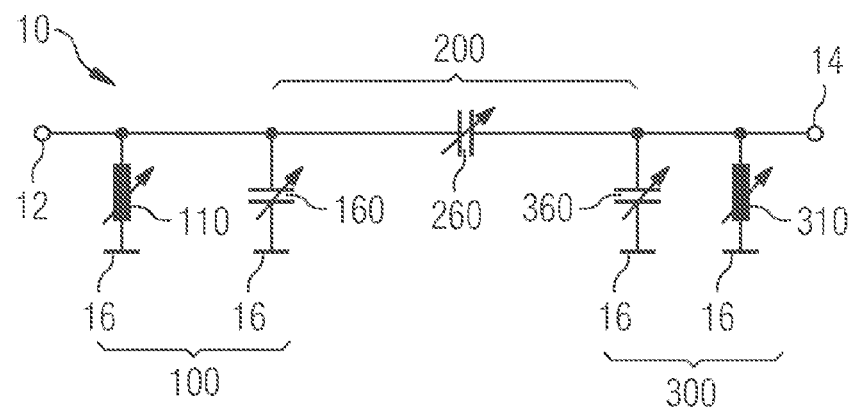
FIG. 6 shows a schematic circuit diagram of an impedance matching network according to further embodiments similar to the one shown in FIG. 4.

FIG. 6 shows a schematic circuit diagram of the impedance matching network 10 according to a further embodiment that is similar to the one shown in FIG. 4. The impedance matching network 10 in FIG. 6 provides protection against electrostatic discharge (ESD) at both sides, i.e., against surges arriving at the first signal terminal 12, as well as against surges arriving at the second signal terminal 14. In the first shunt branch 100, the variable inductive element 110 conducts a high voltage surge as a moderate electrical current towards ground potential at the reference potential terminal 16, thereby protecting the variable capacitive element 160. The ESD protection of the variable capacitive element 360 in the second shunt branch 300 by means of the variable inductive element 310 functions in a similar manner.

Figure 7:
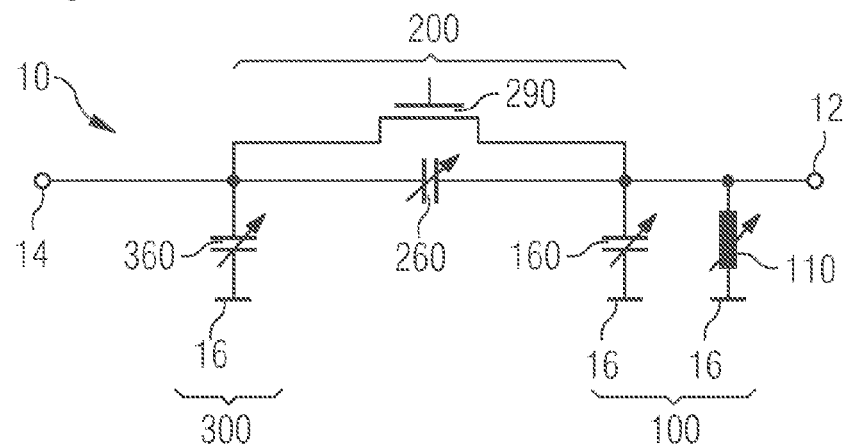
FIG. 7 shows a schematic circuit diagram of an impedance matching network comprising a bypass transistor for the series branch.

FIG. 7 shows a schematic circuit diagram of the impedance matching network 10 according to a further embodiment in which the series branch 200 can be bypassed or comprises a bypass element. The bypass functionality is provided by a field effect transistor 290 acting as a switch element. The switch element or field effect transistor 290 is connected in parallel to the series branch 200. In alternative embodiments the switch element 290 can be regarded as a part of the series branch 200 which is a parallel connection of at least two branches, namely the branch comprising the third capacitive elements 260 and the branch comprising the switch element 290 that extends between the first signal terminal 12 and the second signal terminal 14. In particular at low operating frequencies it may be reasonable to bypass the third capacitive element 260 by means of the switch element 290. Even though the switch element 290 may have a non-negligible on-resistance $R_{on}$, the insertion loss associated with the switch element 290 may still be lower than the insertion loss associated with the third capacitive element 260 at relatively low operating frequencies.

Figure 8:
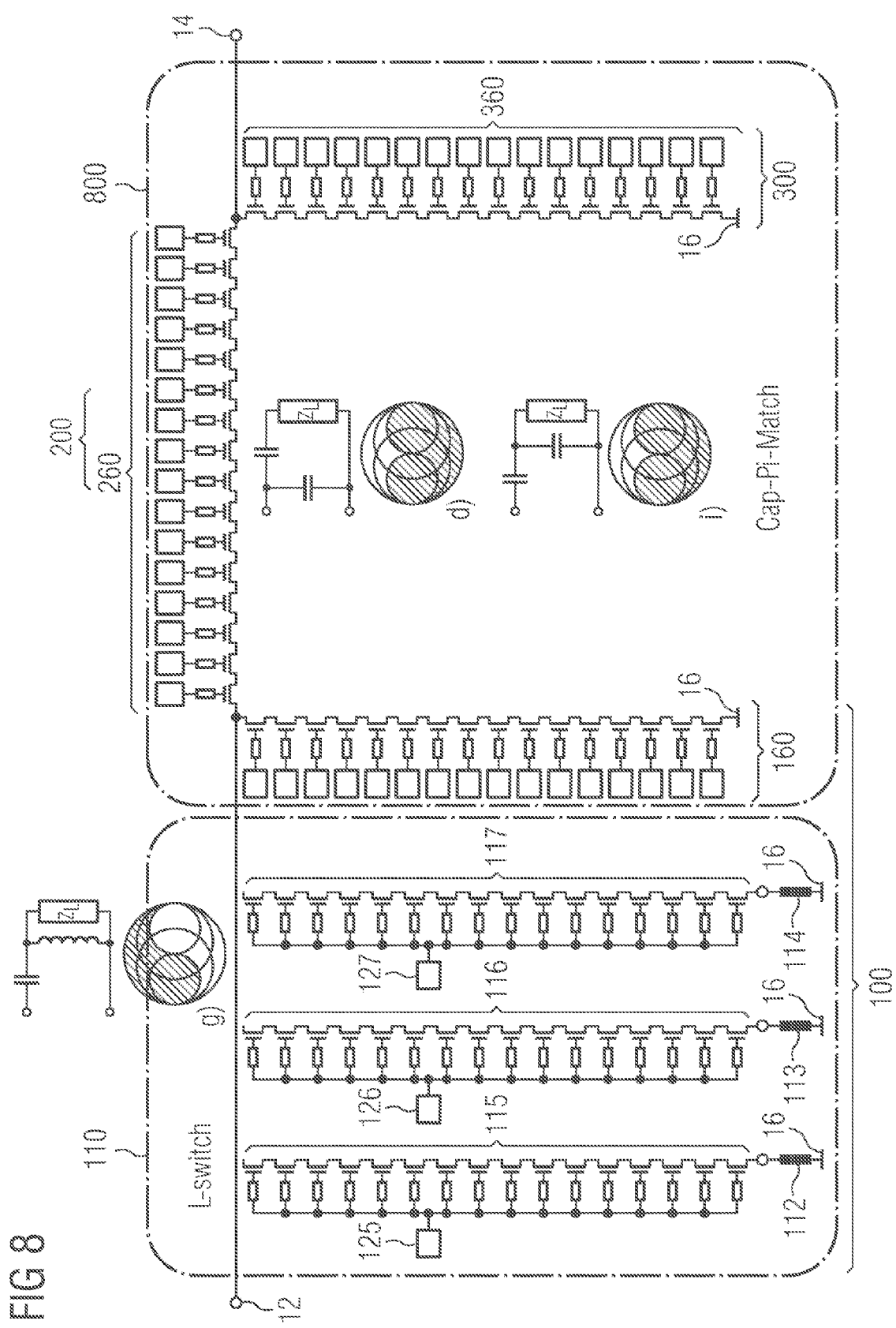
FIG. 8 shows a schematic circuit diagram of an impedance matching network illustrating possible implementation details of the variable inductive element and of the variable capacitive elements.

FIG. 8 shows a schematic circuit diagram of the impedance matching network 10 showing some possible implementation details for the variable inductive element 110 and the first, second, and third variable capacitive elements 160, 260, 360. The variable inductive element 110 comprises three parallel branches between the first signal terminal 12 and the reference potential terminal 16. These three parallel branches form the first shunt branch. Each of the parallel branches comprises a transistors stack 115, 116, and 17, connected in series to a corresponding basic variable inductive element (inductive portion) 112, 113, 114, respectively. Each transistor stack 115, 116, 117 is controlled by an associated circuit 125, 126, or 127 configured to provide a gate voltage for the corresponding transistor stack 115, 116, 117. The three basic inductive elements 112, 113, 114 may have different inductance values in which case seven different overall inductance values can be obtained by individually making the first transistor stack 115, the second transistors stack 116, and/or the third transistors stack 117 conductive. This may be achieved by means of gate voltage controllers 125, 126, and 127. The gate voltage controller 125 provides the gate voltage for all the transistors in the first transistors stack 115. Between the gate voltage controller 125 and each transistor, the variable inductive element 110 comprises a resistor. When all three transistors stacks 115, 160, 117 are non-conductive, the variable inductive element 110 corresponds to an open circuit. Hence, the variable inductive element can assume 8 different states.

The impedance matching network 10 shown in FIG. 8 further comprises an all-capacitive PI-network 800. The first variable capacitive element 160 comprises a stack of 16 series-connected transistors. The gate voltage of each transistor is controlled by an individual gate voltage circuit so that each transistor can be individually controlled to be a conductive state or a non-conductive state. A transistor (in particular a field effect transistor) that is in a conductive state, can be regarded as a resistor $R_{on}$, where in $R_{on}$ is the on-resistance of the transistor. In a non-conductive state, the transistor can be regarded as a capacitor with the capacitance $C_{off}$, where in $C_{off}$ is the off-capacitance of the transistor. By controlling a certain number of the series-connected transistors to be in the conductive state and the remaining transistors in the non-conductive state (thus making use of the off-capacitances $C_{off}$ of the non-conductive transistors), a certain overall capacitance of the variable capacitive element 160 can be obtained. A relatively high overall capacitance value can be obtained if only one transistor is non-conductive and the other transistors (here: the other 15 transistors) are conductive. When all transistors are conductive, the variable capacitive element 160 behaves like a substantially real impedance.

The third variable capacitive element 260 in the series branch 200 has a similar structure as the first variable capacitive element 160. Note that a relatively low-ohmic connection between the first signal terminal 12 and the second signal terminal 14 can be provided if all the transistors of the third variable capacitive element 260 are controlled to be in their conductive state by their corresponding gate voltage controllers (schematically illustrated as 16 little squares in FIG. 8). Accordingly, a relatively low insertion loss can be expected.

The second variable capacitive element 360 has also a similar structure as the first variable capacitive element 160. The PI-network 80 comprising the first, second, and third variable capacitive elements 160, 260, 360 can be regarded as a combination of the basic networks d) and i) shown in FIG. 1.

The first, second, and third variable capacitive elements 160, 260, 360 take advantage of the off-capacitance of a transistor, in particular a field effect transistor, even though the off-capacitance $C_{off}$ is typically regarded as a parasitic, unwanted phenomenon of (field effect) transistors.

The implementation schematically shown in FIG. 8 may require approximately 60 level shifters for generating the various control signals for the transistors. Each of switchable capacitances 160, 260, 360 may be controlled by a 4-bit signal. The switchable inductances 110 may be controlled by a 2-bit or a 3-bit signal.

Figure 9:
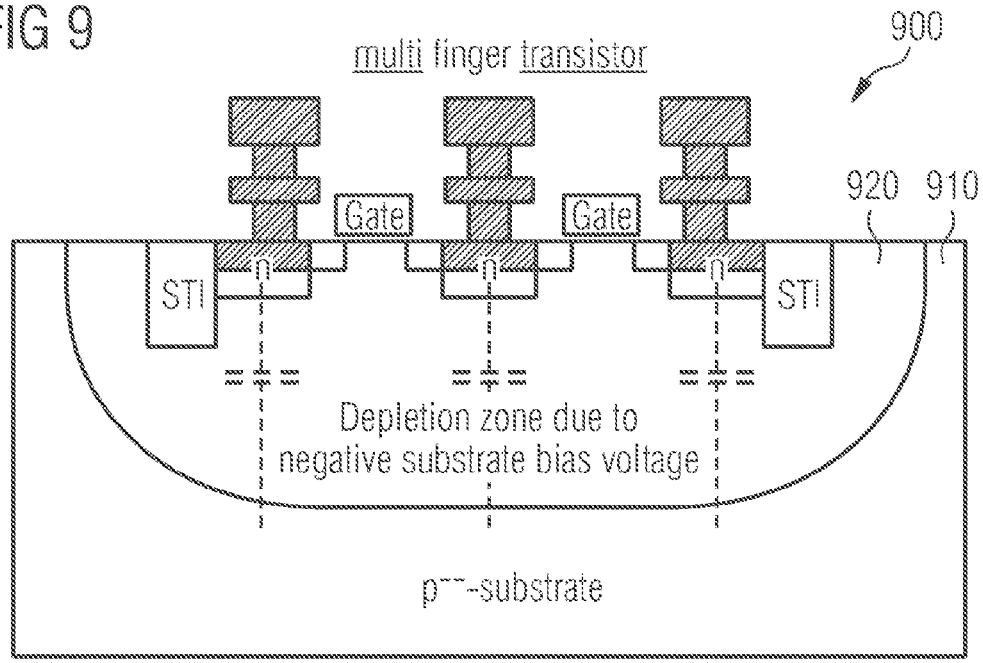
FIG. 9 shows a schematic cross-section of a bulk CMOS transistor.

FIG. 9 shows a schematic cross-section of a so-called bulk CMOS (complementary metal-oxide-semiconductor) transistor 900 that may be used in the variable inductive element 110 and/or the variable capacitive elements 160, 260, 360. The bulk CMOS transistor 900 is formed in a weakly p-doped substrate 910. As illustrated in FIG. 9, the transistor is isolated from the substrate 910 by a large depletion zone 920 due to a negative substrate bias voltage. Like a reverse biased PIN-diode this guarantees a good harmonic behavior. In a lateral direction, the bulk-silicon transistor is isolated by means of a shallow trench isolation (STI). Capacitances between the drain region and/or the source region are schematically illustrated in FIG. 9 by capacitor symbols drawn in dashed line.

Figure 10:
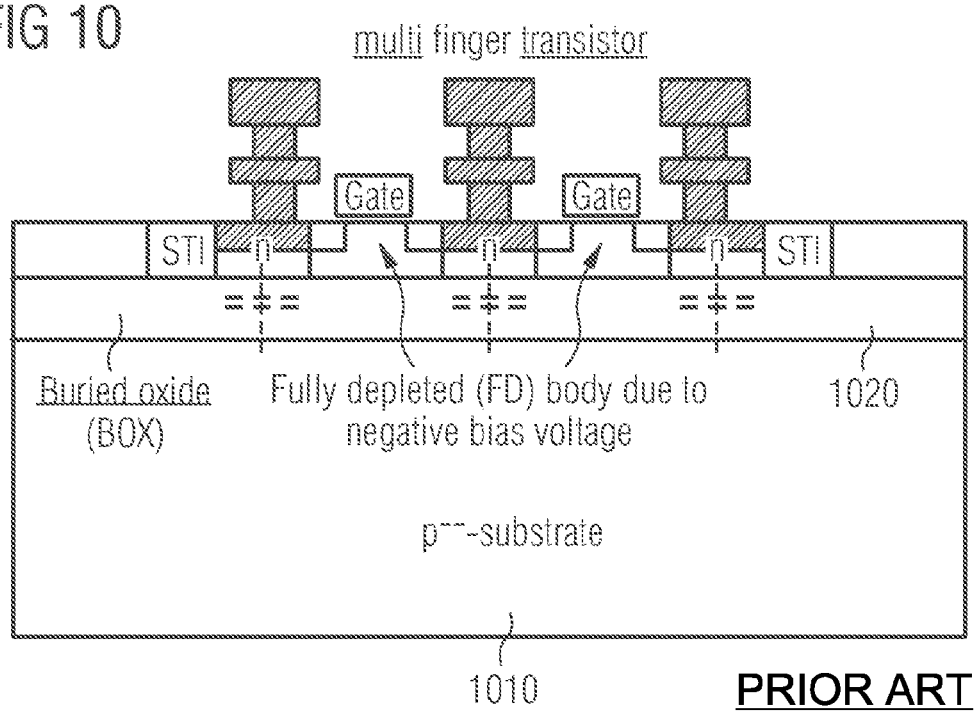
FIG. 10 shows a schematic cross-section of a silicon-on-insulator (SOI) transistor.

FIG. 10 shows a schematic cross-section of a silicon-on-insulator (SOI) transistor. The insulator is provided in the form of a buried oxide (BOX) 1020 that electrically insulates the weakly p-doped substrate 1010 from the actual transistor structure. A fully depleted (FD) body due to negative bias voltage can be observed in the channel region of the transistor.

Typically, a charge pump is needed for both, the bulk CMOS transistor schematically illustrated in FIG. 9, and also for the SOI transistors schematically illustrated in FIG. 10. The heat conductivity of the SOI transistor is typically lower compared to the bulk-substrate transistor.

Figure 11A:
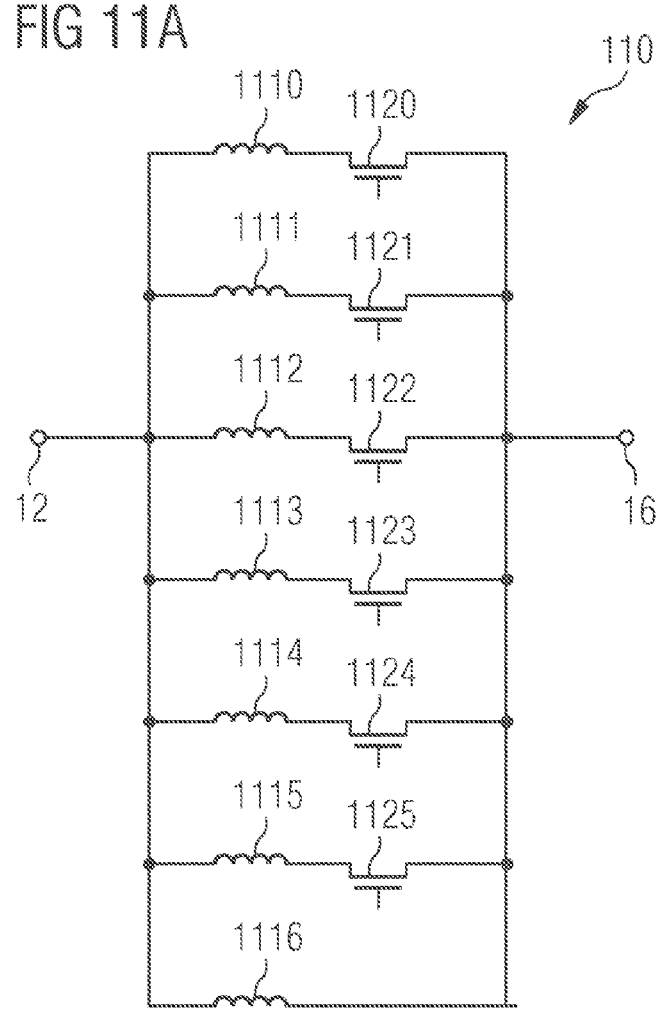
FIG. 11A shows a schematic circuit diagram of one possible implementation of a variable inductive element.

FIGS. 11A to 12D schematically show how the variable inductive element(s) 110, 310 may be implemented. FIG. 11A shows a first option in which the variable active element comprises a switch with several coils or basic inductive elements (inductive portions) that are switchable and/or commutatable. In particular, the variable inductive element shown in FIG. 11A comprises seven parallel branches. Typically, each of the seven parallel branches extends between the first signal terminal 12 and the reference potential terminal 16. Each of the parallel branches comprises a basic inductive element 1110 to 1116. Six of the seven parallel branches comprise a switch element 1120 to 1125. Each of these switch elements 1120 to 1125 is connected in series with a corresponding basic inductive element 1110 to 1115.

The variable inductive element 110 schematically shown in FIG. 11A may also be described as comprising a first inductive portion 1110, a second inductive portion 1111, and a switch element 1120 that is configured to selectively connect at least one of the first inductive portion 1010 and the second inductive portion 1111 between the first signal terminal 12 and the reference potential terminal 16.

In the configuration according to FIG. 11A, the variable inductive element 110 comprises seven inductive portions 1110 to 1116 and six switch elements 1120 to 1125 configured to selectively connect the six inductive portions 1110 to 1115 between the first signal terminal 12 and the reference potential terminal 16. The switch elements 1120 to 1125 may be transistors and are typically configured to be controllable in an individual manner so that different conductances can be obtained between the first terminal (in the example shown in FIG. 11A: the first signal terminal 12) and a second terminal (in the example of FIG. 11A: the reference potential terminal 16).

The first inductive portion 1110, the second inductive portion 1111, and the further inductive portions 1112 to 1116 may have different inductance values so that a large range of different inductance values of the entire variable inductive element 110 can be obtained by combining different branches or using only one parallel branch at a time. The variable inductive element 110 may also be described as comprising at least two parallel branches (seven parallel branches in the example configuration shown in FIG. 11A), wherein each parallel branch comprises an inductive portion 1110 to 1116. At least one parallel branch further comprises a switch element 1120 connected in series with the corresponding inductive portion 1110 to 1115, respectively. The variable inductive element 110 shown as an example in FIG. 11A comprises six parallel branches having a switch element 1120 to 1125, respectively.

Figure 11B:
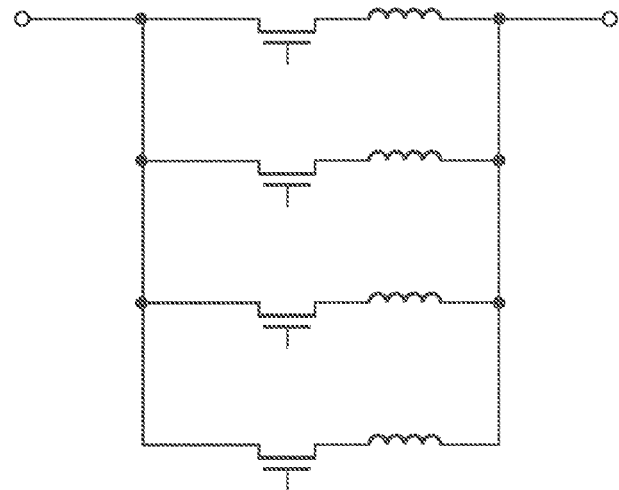
FIG. 11B shows a schematic circuit diagram of another possible implementation of a variable inductive element.

FIG. 11B shows a schematic circuit diagram of another possible implementation of a variable inductive element. In FIG. 11B the variable inductive element comprises four parallel branches, each branch comprising a series connection of a transistor and an inductor. With this arrangement, a relatively high quality factor can be achieved. However, the arrangement requires relatively much area.

Figure 11C:
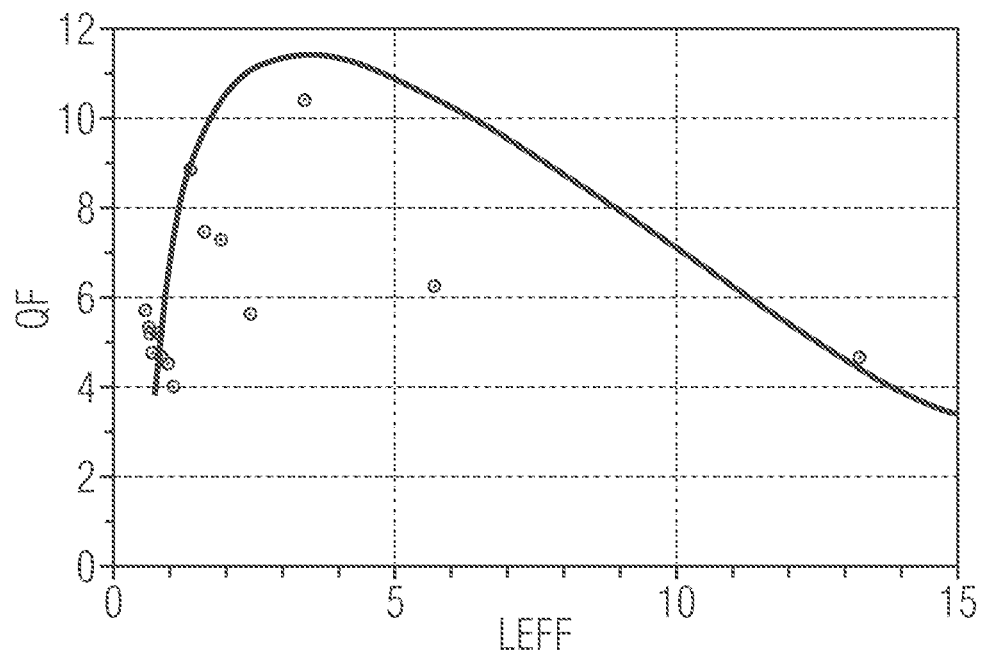
FIG. 11C is a graph of the quality factor over the effective inductance of the variable inductive element in FIG. 11B when the four transistors of the variable inductive element are substantially equal.

FIG. 11C is a graph of the quality factor over the effective inductance of the variable inductive element in FIG. 11B when the four transistors of the variable inductive element are substantially equal. In particular, the channel widths W of the four transistors are substantially equal, i.e., W=W1=W2=W3=W4. The graph in FIG. 11C shows the quality factor QF over effective inductance LEFF at a frequency of 1.8 GHz.

Figure 11D:
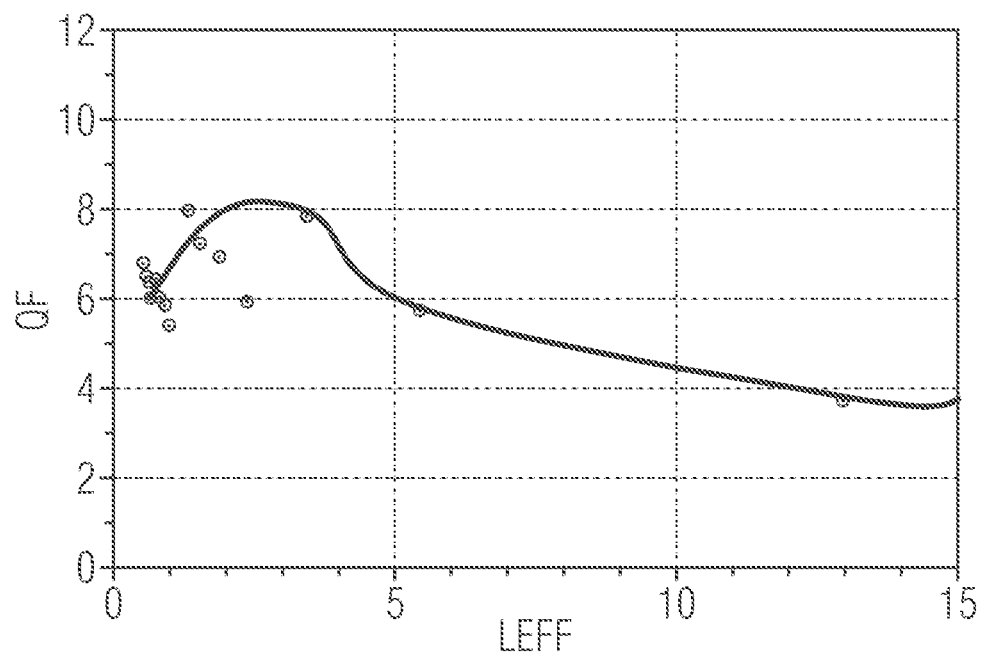
FIG. 11D is a graph of the quality factor over the effective inductance of the variable inductive element in FIG. 11B when the four transistors of the variable inductive element have different channel widths.

FIG. 11D is a graph of the quality factor over the effective inductance of the variable inductive element in FIG. 11B when the four transistors of the variable inductive element have different channel widths. The channel widths of the different transistors may be chosen to be reciprocate to the inductance of the inductor with which the transistor at hand is connected in series, i.e., W~1/L (W proportional to 1/L). This, in turn, also leads to the resistance of the transistor being proportional to the inductance of the inductor in the corresponding branch, i.e., R~L.

FIG. 12A shows a schematic circuit diagram of a variable inductive element 110 according to further embodiments in which a single coil or inductive element or several series-connected coils are tapped by a switch element or several switch elements. Typically, the variable inductive element 110 according to the arrangement shown in FIG. 12A is more space-saving than the variable inductive element 110 schematically shown in FIG. 11. The variable inductive element 110 according to the arrangement shown in FIG. 12A may require microelectronic integration, or it may be desirable to provide the variable inductive element 110 shown in FIG. 12A as an integrated circuit or as a part of an integrated circuitry.

The variable inductive element 110 schematically shown in FIG. 12A comprises five basic inductors (inductive portions) 1210, 1211, 1212, 1213, and 1214 that are connected in series between a first terminal and a second terminal of the variable inductive element 110. (As an example only, and for easier orientation, these terminals coincide in FIG. 12A with the first signal terminal 12 and the reference potential terminal 16. Notwithstanding, the variable inductive element 110 could be connected to other nodes of the impedance matching network.) The variable inductive element 110 further comprises a plurality of switch elements 1220, 1221, 1222, 1223, and 1224. Each switch element of the switch elements 1220 to 1223 is connected, at a first side, to a node between two of the basic inductors 1210 to 1214 and, at second side, to the second terminal of the variable inductive element 110 (in the example schematically shown in FIG. 12A: the reference potential terminal 16). The switch element 1224 is connected in series with all the basic inductors or inductive portions 1210 to 1214.

Thus, the variable inductive element 110 comprises a series connection of at least two inductive portions 1210 to 1214. The variable inductive element 110 further comprises a switch element 1220 to 1224 that is connected in parallel to a bypassable inductive portion of the at least two inductive portions. The switch element 1212 to 1224 is configured to selectively bypass the bypassable inductive portion. For example, the switch element 1220 is connected at a first side to a node that is between the inductive portions 1210 and 1211. Moreover, the switch element 1220 is parallel to a series connection of the inductive portions 1211 to 1214 and the switch element 1224. In other words, the four inductive portions 1211, 1212, 1213, and 1214 for the bypassable inductive portion are associated to the switch element 1220. In order to give one more example, consider the switch element 1223: the bypassable inductive portion that is associated to the switch element 1213 comprises the inductive portion 1214.

The variable inductive element(s) 110, 310 may be an integrated circuit or a portion of an integrated circuit, such as a microchip. Accordingly, the inductive portions 1110 to 1116 and/or 1210 to 1214 may be formed using semiconductor manufacturing technology. For example, the inductive portions may be implemented as metallic traces that are structured in one or more metallization layers of the integrated circuit. In combination with the proposed configuration of the impedance matching network, it may typically be acceptable that the quality factor of an integrated variable inductive element may possibly be lower than the quality factor of a separate inductive element, such as a SMD component. The reason is that the variable inductive element 110 is typically not used in the series branch 200 of the impedance matching network 10, but in the shunt branch or the shunt branches 100, 300.

Figure 12B:
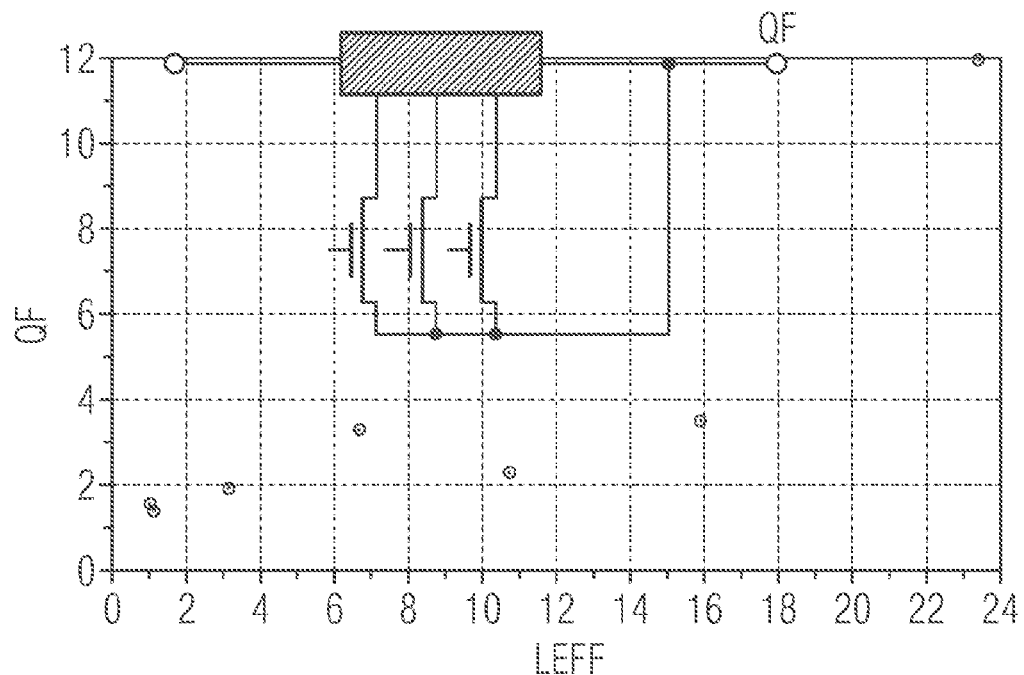
FIG. 12B shows a schematic circuit diagram of another possible implementation (comprising "shorting lines") of the variable inductive element and a graph of the quality factor over effective inductance.

FIG. 12B shows a schematic circuit diagram of another possible implementation (comprising "shorting lines") of the variable inductive element and a graph of the quality factor over effective inductance. It can be seen that only relatively low quality factors can be obtained.

Figure 12C:
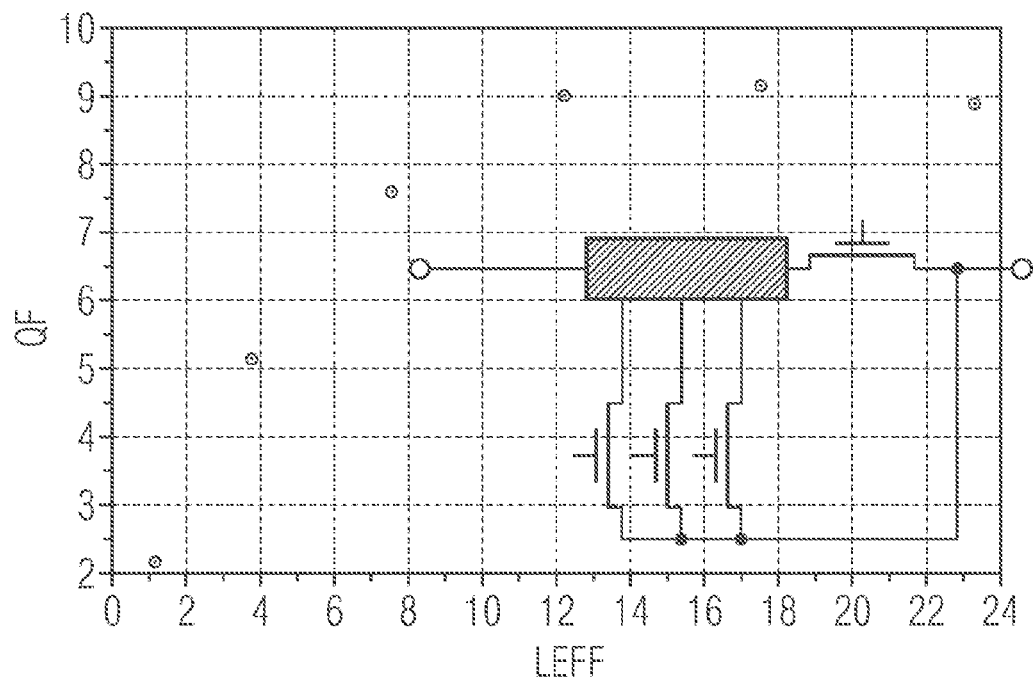
FIG. 12C shows a schematic circuit diagram of yet another possible implementation (comprising "selecting lines") of the variable inductive element and a graph of the quality factor over effective inductance.

FIG. 12C shows a schematic circuit diagram of yet another possible implementation (comprising "selecting lines") of the variable inductive element and a graph of the quality factor over effective inductance. FIG. 12D is a graph of the effective inductance over frequency of the variable inductive element in FIG. 12C for four different transistor settings. It can be seen that a better average quality factor can be achieved. The frequency response of the inductance in FIG. 12D reveals that self-resonances occur around which may are believed to be caused by the off-capacitance $C_{off}$ of the transistors and the high inductance L.

Figure 13:
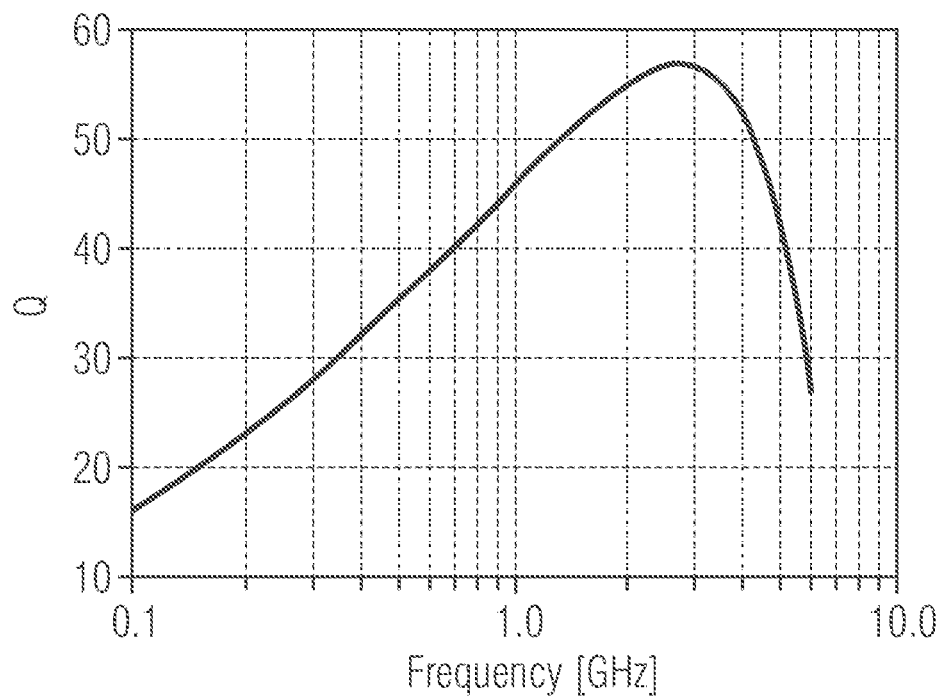
FIGS. 13 to 16 show different dependencies of the quality factor versus frequency for four different inductive elements with fixed inductance.
Figure 14:
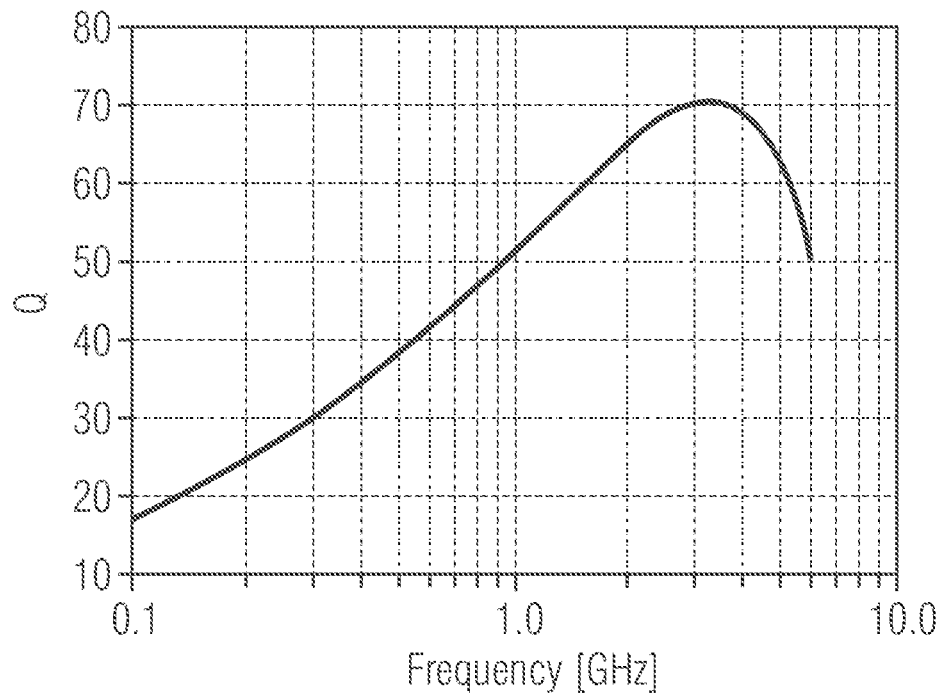

FIGS. 13 to 16 are graphs illustrating the quality factors versus frequency of four different inductive elements with fixed inductance in order to give an impression of how the quality factor is affected by the design of the inductive element and the frequency. FIGS. 13 and 14 show the frequency-dependent quality factors for two wire-wound inductive elements, in particular from the LQW series of Murata Manufacturing Co., Ltd, a Japanese manufacturer of electronic components. FIG. 13 shows the quality factor over frequency of a 6 nH inductive element and FIG. 14 shows the quality factor over frequency for a 10 nH inductive element. It can be seen that the maximal quality factor is between 55-70. At a frequency of 0.9 GHz a quality factor of $Q_{0.9\ GHz}=45\text{-}50$ can be observed. At a frequency of 1.9 GHz a quality factor of $Q_{1.9\ GHz}=55\text{-}65$ can be observed.

Figure 15:
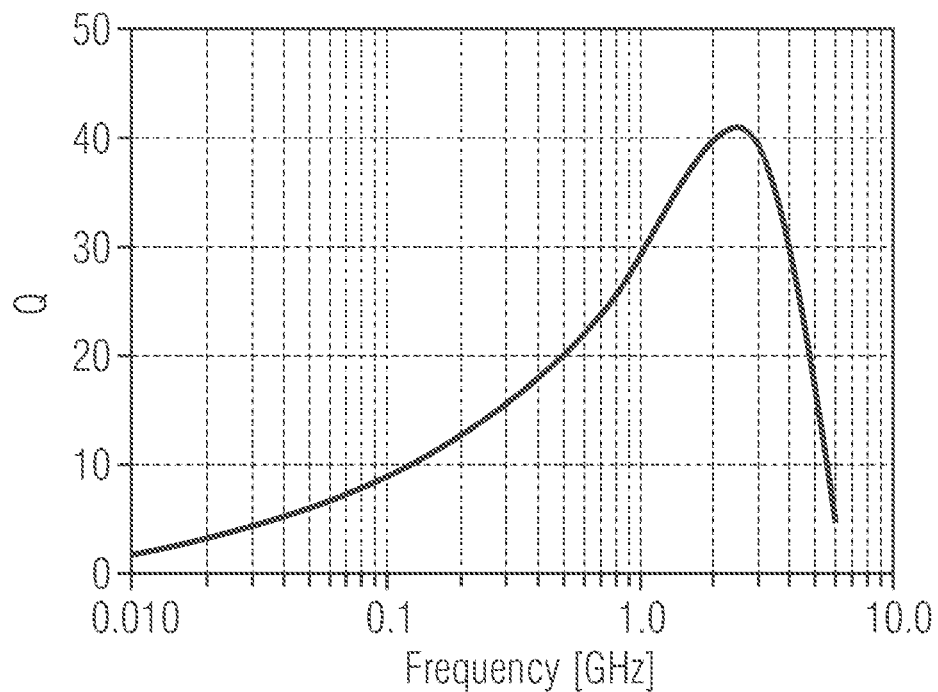
Figure 16:
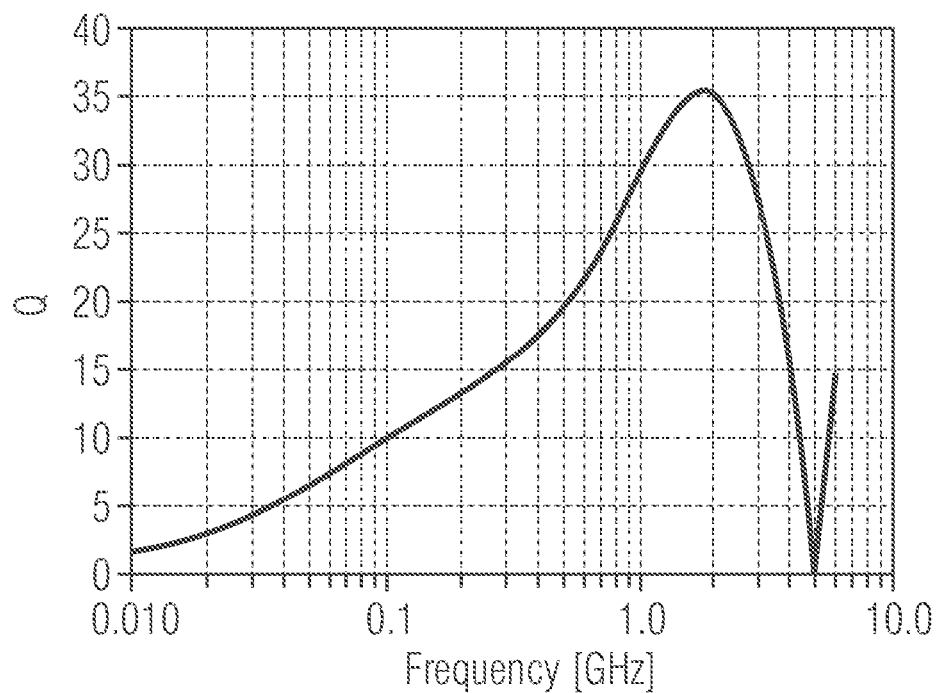

For comparison purposes, FIGS. 15 and 16 illustrate the frequency-dependent quality factor for two inductive elements from Murata's LQP series. FIG. 15 shows the quality factor of a 6 nH inductive element and FIG. 16 shows the quality factor over frequency of a 10 nH inductive element. The LQP series covers RF inductors (over several 10 MHz) of the film type based on non-magnetic material. The LQP series of chip inductors (chip coils) consists of compact, high-performance inductors. The manufacturer claims that the chip inductors have no DC resistance and outstanding high-frequency characteristics. The maximal quality factor is in the range of Qmax=30 . . . 40.

Planar coils in copper (Cu) metal technologies are capable of achieving maximal quality factors Qmax in the range from 20 . . . 30. Planar coils in aluminum (Al) metal technologies typically have a maximal quality factor of approximately 10 (with conductive substrate, the maximal quality factor may go down to 5).

As already mentioned above, the maximal quality factors for capacitive elements are typically significantly higher, as will be explained below in the context of the description of FIGS. 19 and 20.

Figure 17:
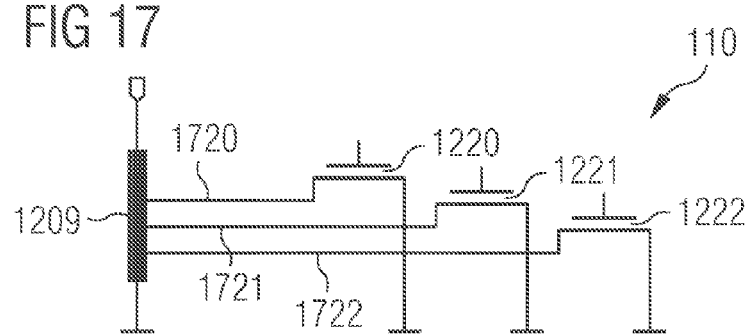
FIG. 17 shows a schematic circuit diagram of a variable inductive element comprising three switch elements connected to three different taps of an inductor in a shunt branch.

FIG. 17 shows a schematic circuit diagram of a variable inductive element 110 according to one possible configuration. The variable inductive element 110 shown in FIG. 17 is similar to the variable inductive element 110 shown in FIG. 12A. In FIG. 17 the variable inductive component 110 comprises a main inductor 1209. The main inductor 1209 in turn comprises several inductive portions. A plurality of switch elements 1220 to 1222 are connected to different taps 1720,

1721, 1722 of the main inductor 1209. In this manner, each switch element 1220 to 1222 is configured to bypass a corresponding bypassable inductive portion of the main inductor 1209.

Figure 18A:
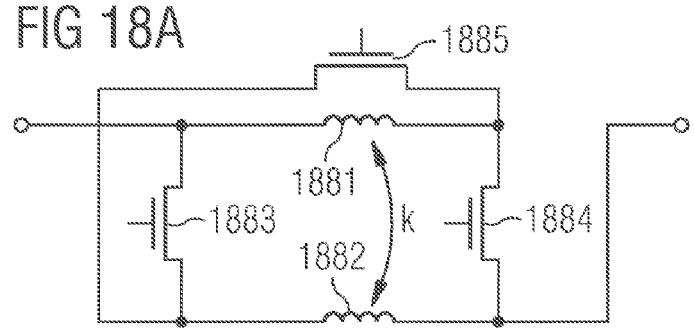
FIG. 18A shows a schematic circuit diagram of a variable inductive element according to a further possible implementation comprising two inductors connectable in parallel or in series.
Figure 18B:
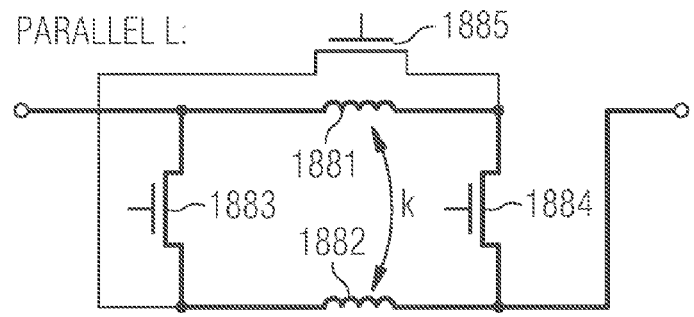
FIG. 18B shows the variable inductive element of FIG. 18A when the two inductors are connected in parallel.
Figure 18C:
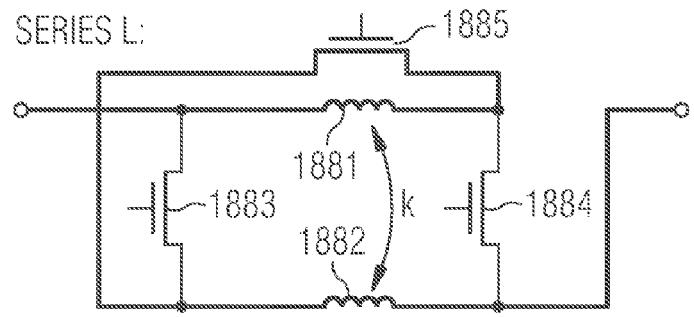
FIG. 18C shows the variable inductive element of FIG. 18A when the two inductors are connected in series.

FIG. 18A shows a schematic circuit diagram of a variable inductive element according to a further possible implementation comprising two inductors connectable in parallel or in series. In this manner, one inductor structure can be used to provide to inductor values. Hence, FIG. 18A and the following FIGS. 18B, 18C and 18H show a space saving approach. The variable inductance element comprises a first inductor 1881, a second inductor 1882, a first parallel switching element 1883, a second parallel switching element 1884, and a series switching element 1885. The first and second inductors 1881 and 1882 are inductively coupled as indicated by a coupling factor k in FIG. 18A.

FIG. 18B shows the variable inductive element of FIG. 18A when the two inductors are connected in parallel. The first and second switching elements 1883 and 1884 are conducting which the series switching element 1885 is non-conducting. Thus, the two inductors 1881 and 1882 are connected in parallel. The thick lines in FIG. 18B indicate the connections that are conducting.

FIG. 18C shows the variable inductive element of FIG. 18A when the two inductors are connected in series. The series switching element 1885 is conducting, while the first and second parallel switching elements 1883 and 1884 are non-conducting. The thick lines in FIG. 18C indicate the connections that are conducting.

Figure 18D:
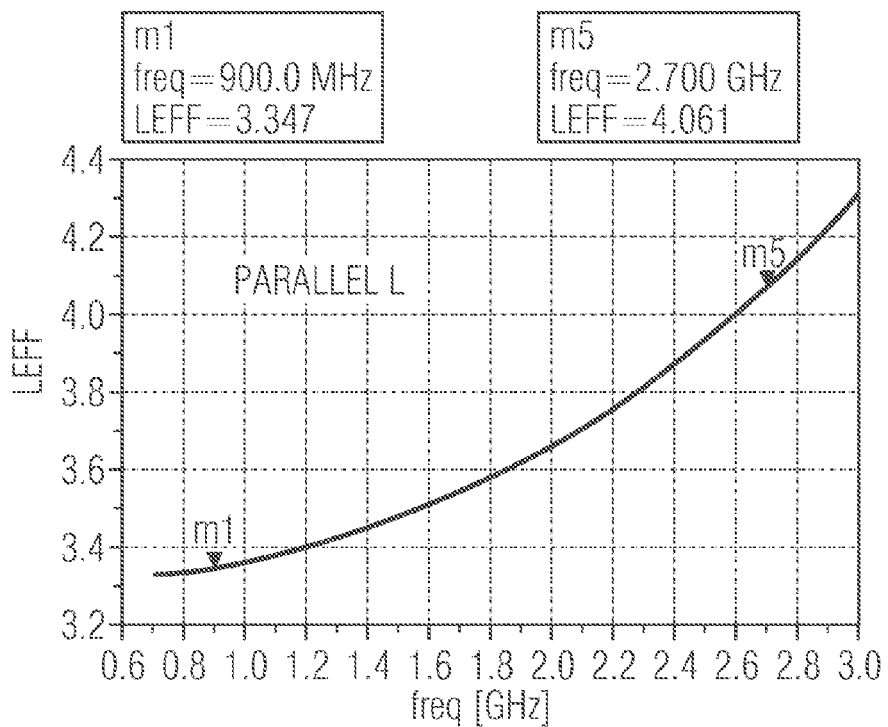
FIG. 18D shows a graph of the effective inductance over frequency of the variable inductive element in FIG. 18A for the parallel configuration.

FIG. 18D shows a graph of the effective inductance over frequency of the variable inductive element in FIG. 18A for the parallel configuration.

Figure 18E:
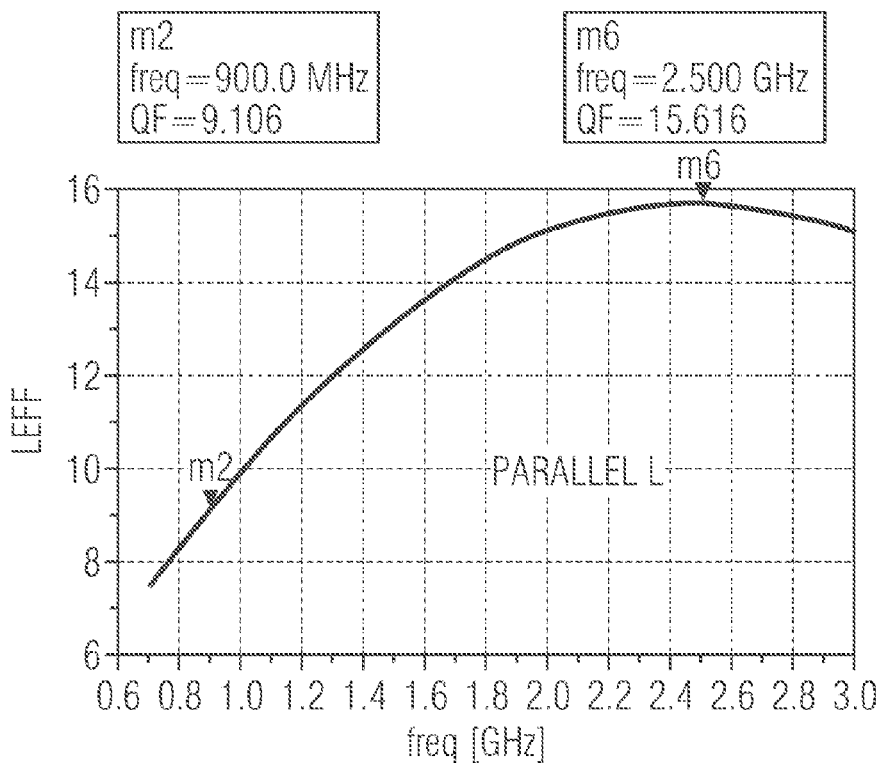
FIG. 18E shows a graph of the quality factor over frequency of the variable inductive element in FIG. 18A for the parallel configuration.

FIG. 18E shows a graph of the quality factor over frequency of the variable inductive element in FIG. 18A for the parallel configuration.

Figure 18F:
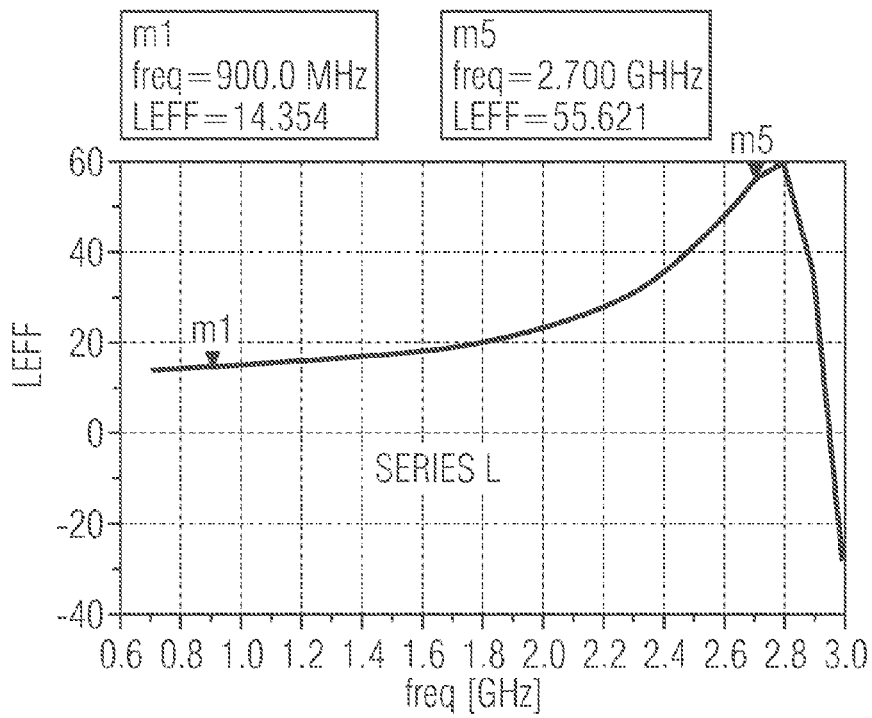
FIG. 18F shows a graph of the effective inductance over frequency of the variable inductive element in FIG. 18A for the series configuration.

FIG. 18F shows a graph of the effective inductance over frequency of the variable inductive element in FIG. 18A for the series configuration.

Figure 18G:
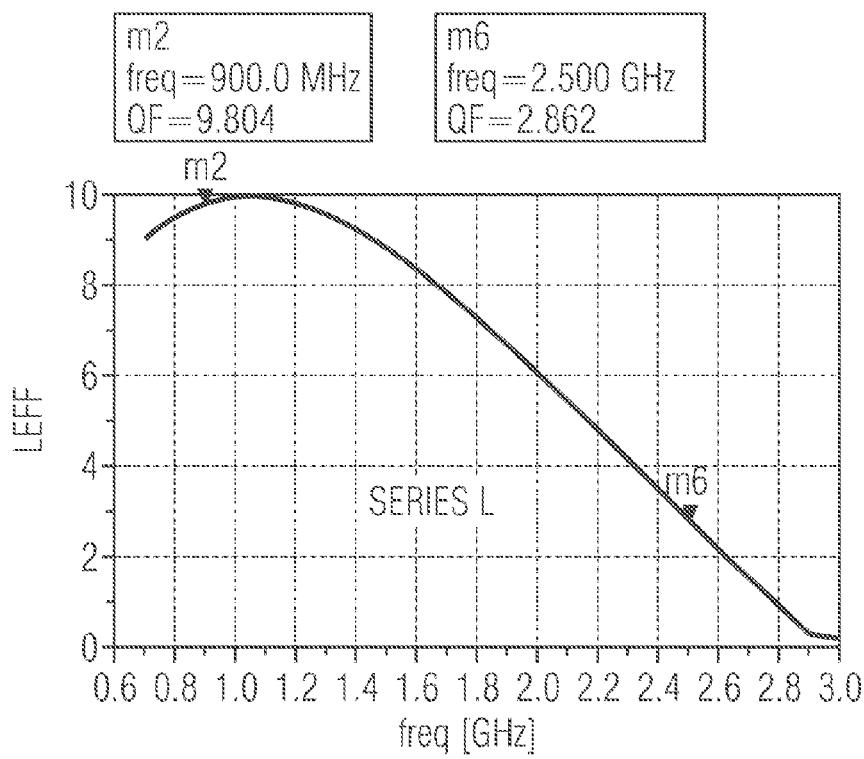
FIG. 18G shows a graph of the quality factor over frequency of the variable inductive element in FIG. 18A for the series configuration.

FIG. 18G shows a graph of the quality factor over frequency of the variable inductive element in FIG. 18A for the series configuration. When comparing the quality factors for the parallel connection (FIG. 18E) and for the series connection (FIG. 18G) it can be seen that a higher maximal quality factor Qmax can be achieved for the parallel configuration.

FIG. 18H shows a schematic plan view of a possible arrangement of the two inductors 1881 and 1882 of the variable inductive element shown in FIG. 18A.

The variable inductance element shown in FIG. 18A may be extended by using three inductors, four inductors, or even more conductors. Typically, each switching element 1883, 1884, 1885 comprises a stack of several transistors, depending on the expected maximal voltage across the switching element. This stacking of transistors can be adapted to the voltage requirements. In particular, for the first and second parallel transistors 1883 and 1884 only half of the transistors is needed, as the input voltage for the variable inductive element is split up so that each of the first and second parallel switching elements sees only approximately half of the input voltage. It is therefore possible to reduce the number of transistors for the parallel switching elements 1883 and 1884 which in turn improves the quality factor of the variable inductive element.

Figure 19:
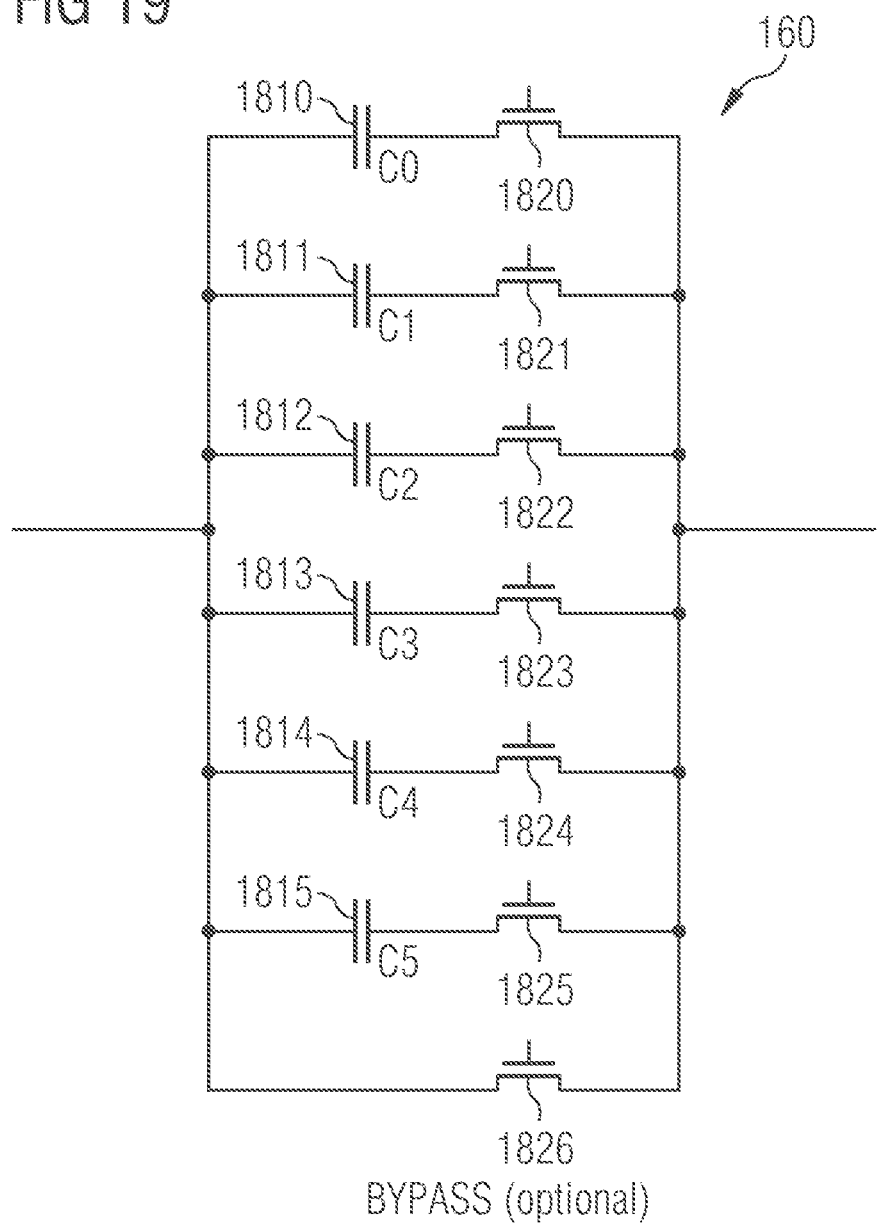
FIG. 19 shows a schematic circuit diagram of a variable capacitive element comprising several basic capacitors (capacitive portions), each basic capacitor being connected in series to a corresponding switch transistor.

FIG. 19 shows a schematic circuit diagram of a variable capacitance element 160. In case the impedance matching network 10 requires a variable capacitance element, a combination of a switch element and a capacity may be employed for such a variable capacity. The variable capacitance element 160 schematically illustrated in FIG. 19 comprises a plurality of parallel branches (at least two parallel branches). Each parallel branch comprises a switch element 1820 to 1826. At least one parallel branch further comprises a capacitor 1810 to 1815 connected in series with the corresponding switch element 1820 to 1825. In the configuration schematically shown in FIG. 19, a further parallel branch is provided as an optional bypass branch that comprises the switch element 1826. At least two parallel branches may comprise capacitors 1810 to 1815 in different capacitances. In FIG. 19, the switch elements 1820 to 1826 are depicted as single field effect transistors. However, the switch elements 1820 to 1826 may be implemented as a series connection of a plurality of transistors. The number of series connected transistors may be different in at least two of the parallel branches. For example, the switch element 1820 may comprise more series-connected transistors than the switch element 1821. The implementation of a switch element using a plurality of series-connected transistors will be explained in more detail below.

Note that in the variable capacitance element 160 shown in FIG. 19 each bit (e.g., corresponding to a control signal or gate signal for one of the switch elements 1820 to 1826) switches a particular capacity of the plurality of capacities 1810 to 1815, and that the combination of several capacities allows further values. The maximal voltage needs to be observed, which occurs in the switch-off case. The voltage is dropped across the capacity 1810 to 1815 (typically large compared to the capacity of the transistor) and the transistor capacity. However, a major portion of the voltage is dropped across the transistor 1820 to 1826 and not across the actual capacity 1810 to 1815. This is due to the series connection of a capacity 1810 and a corresponding transistor 1820, because in the case of series-capacities the high HF voltages always drop across the small capacities.

Figure 20A:
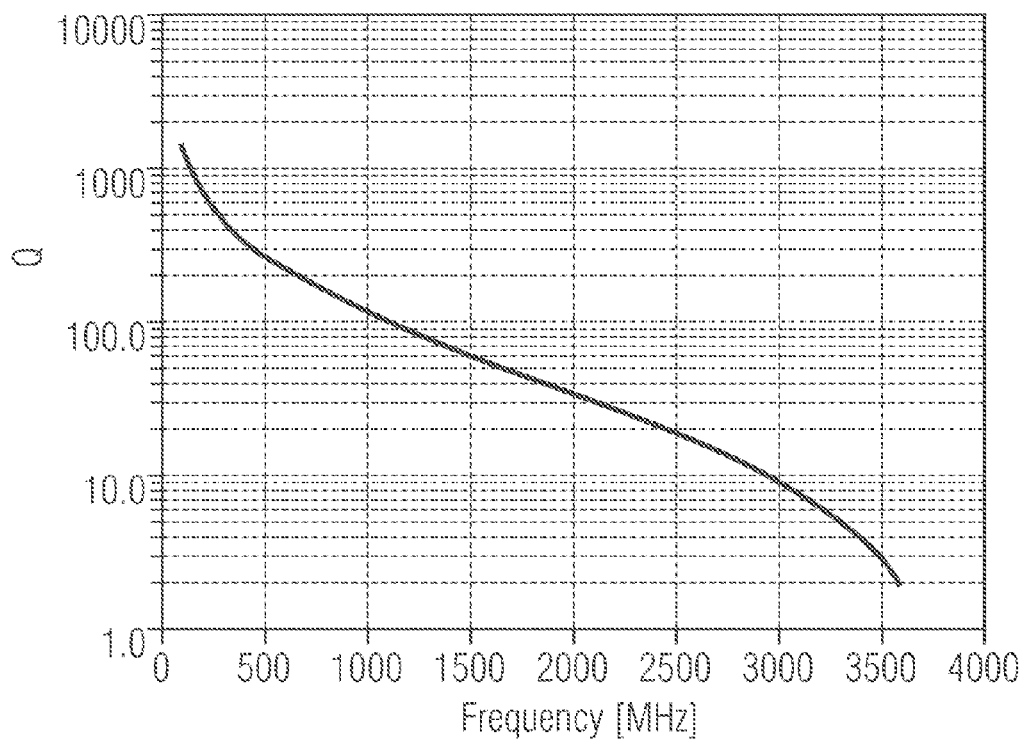
FIGS. 20A and 20B show graphs of different dependencies of the quality factor of capacitive elements with fixed capacitance values.
Figure 20B:
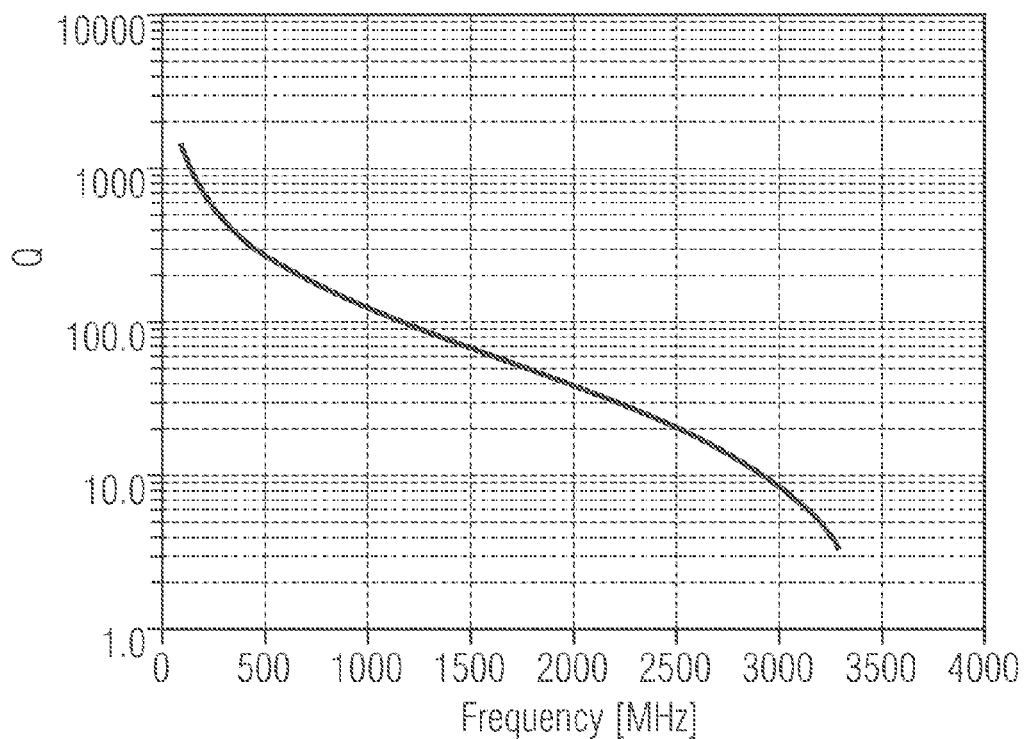

FIGS. 20A and 20B show graphs of the frequency-dependent quality factor of commonly available capacitive elements for reference and comparison purposes. FIG. 20A shows a quality factor versus frequency for a 5 pF monolithic ceramic capacitor. FIG. 20B shows the quality factor versus frequency for a 10 pF monolithic ceramic capacitor. In both cases the quality factor is approximately 100 at a frequency of 1 GHz but then drops significantly to approximately 20 at a frequency of 2.5 GHz. As a further information it is indicated that metal-insulator-metal capacitors in chips typically achieve quality factors between 80 and 100.

As a conclusion of FIGS. 13 to 16, 20A and 20B it can be said that the quality factors of capacitors or capacitances are in general much higher than the quality factors of inductors, at least in the domain of highly integrated microelectronic circuits for RF and HF applications.

FIGS. 21 and 22 graphically illustrate how the quality factors of variable capacitive elements behave when the overall capacitance is changed. The quality factors of tunable devices are usually lower and dependent on the instantaneous inductance and/or capacitance value, i.e., they are L/C value-dependent. In the case of an inductor, a switch may be provided. However, the loss caused by the switch typically degrades the quality factor. For capacitors (e.g., microelectromechanical (MEM) and barium-strontium-titanate (BST) capacitors) the resistance value R typically remains the same, but the capacitance C changes. For those tunable inductors and tunable capacitors the following is typically true: the quality factor Q cannot be maximal for all inductance and/or capacitance values.

Tunable capacitances may achieve high quality factors and allow for a real "analog" tuning, i.e., a very fine adjustment. When implemented as MEMS, a good linearity can be achieved. On the other hand, a digital-to-analog converter is typically required to control the tunable devices, which lead to extra effort and tolerance. In particular BST capacitances show a dependency of the tolerance on the temperature. In contrast, MEMS-based tunable capacitances require a certain time for switching and may be exposed to mechanical stress which may degrade the accuracy of the capacitance. A voltage dependent device typically has linearity issues (BST). Also for MEMS the linearity might not be that good because the silicon substrate may generate second harmonic (H2) and third harmonic (H3) distortions. Typically, a real galvanic switching is not possible with BST capacitances or MEMS capacitances. Last but not least, size and cost of tunable capacitances are typically relatively extensive and therefore typically unattractive for high volume manufacturing.

As an alternative to tunable capacitances, a switched capacitance bank may be employed. A switched capacitance bank can typically act as a galvanic switch so that a bypass and/or inductor switching is possible. The behavior with respect to harmonics and intermodulation distortion (IMD) is substantially the same as for the switching element(s) that is/are used; this is typically better than, e.g., today's BST devices. The switchable capacitance does not require a digital-to-analog converter, the control is easier than for a tunable device, and typically no extra chip(s) is/are required. The switchable capacitance can be switched very fast, i.e., the switching time is relatively fast. In contrast to MEMS-based tunable capacitances, no mechanics are involved so that mechanics issues are avoided. The tolerance that have to be expected are typically determined by the capacitor tolerances. No add-on tolerances such as temperature (BST), mechanics (MEMS→microphony), and/or DAC accuracies have to be taken into account. Integration of a switched capacitance is typically relatively straight forward and compatible with a large number of microelectronic manufacturing processes.

However, with an increasing number of steps, more parasitics ($C_{off}$, $R_{on}$) have to be expected and more chip size has to be provided for the switched capacitance. High quality factors can only be achieved with selected materials, e.g., copper (inductors), and for capacitors the quality factor varies over the different states, i.e., the maximal quality factor Qmax cannot be achieved for every state.

FIG. 21 shows an example for a tunable capacitor. The lower part in FIG. 21 shows the schematic circuit diagram of the tunable capacitor. It comprises four capacitive portions 2110 to 2113. Each capacitive portion 2110 to 2113 is arranged in one of four parallel branches. Each branch further comprises a switch element 2120 to 2123 so that the corresponding parallel branch can be activated or deactivated by closing or opening the switch element 2120 to 2123. The capacitive portions 2110 to 2113 may be MIM capacitors.

The upper part in FIG. 21 shows the dependency of the quality factor as a function of the overall capacitance CEFF for two different frequencies, namely 900 MHz and 1.9 GHz. It can be seen that the quality factor increases with increasing overall capacity CEFF and a frequency of 900 MHz. In contrast, the quality factor QF decreases with increasing capacitance at a frequency of 1.9 GHz.

FIG. 22 is similar to FIG. 21, but relates to a different structure of the variable capacitive element, namely a series connection of four transistors without dedicated capacitors. This means, that the drain-source capacitances of the four transistors provide the capacitance for the variable capacitive element. As schematically illustrated in FIG. 22, each transistor can be modeled as a capacitor (i.e., the drain-source capacitance) and, in parallel to said capacitor, a series connection of a switch and a resistor. The resistor corresponds to the on-resistance $R_{on}$ of the transistor. In the upper part of FIG. 22, the capacity-dependent quality factor QF of the variable capacitive element using 16 transistors is graphically illustrated for a first frequency of 900 MHz and a second frequency of 1.9 GHz. Except for very small values of the overall capacitance, the quality factor is higher for the 900 MHz case than for the 1.9 GHz case. Furthermore, for CEFF>1 pF the quality factor increases with increasing overall capacitance. The maximal quality factor is between 100 and 110 for relatively low overall capacitance values.

One challenge that has to be overcome when trying to achieve high quality factors is that the maximal quality factor (small R, maximal C) is obtained only when the ratio of imaginary part (capacity) to real part (transistor $R_{on}$) becomes maximal. An additional challenge is that also the switch transistor presents a capacity, namely its off-capacity $C_{off}$ when the transistor is non-conductive, i.e., the transistor blocks. For this reason the best quality factor is achieved in the "all-off" mode (since only parasitic capacity $C_{off}$ of the transistors is present, but no on-resistance $R_{on}$). Other than that, in a variable capacitive element having a configuration as shown in FIG. 19 (i.e., with at least two parables branches, each branch comprising a capacitive portion), the quality factor decreases with increasing overall capacity, because every bit that is additionally switched on, is based on a parallel connection of two quality factors. The large capacitances represent, just as with analog-to-digital converters, the most significant bit (MSB) and the small capacitances the least significant bit (LSB). Since smaller capacitance contributions necessarily have a smaller quality factor given a constant on-resistance $R_{on}$, the overall quality factor also decreases in a concurrent manner.

Figure 23:
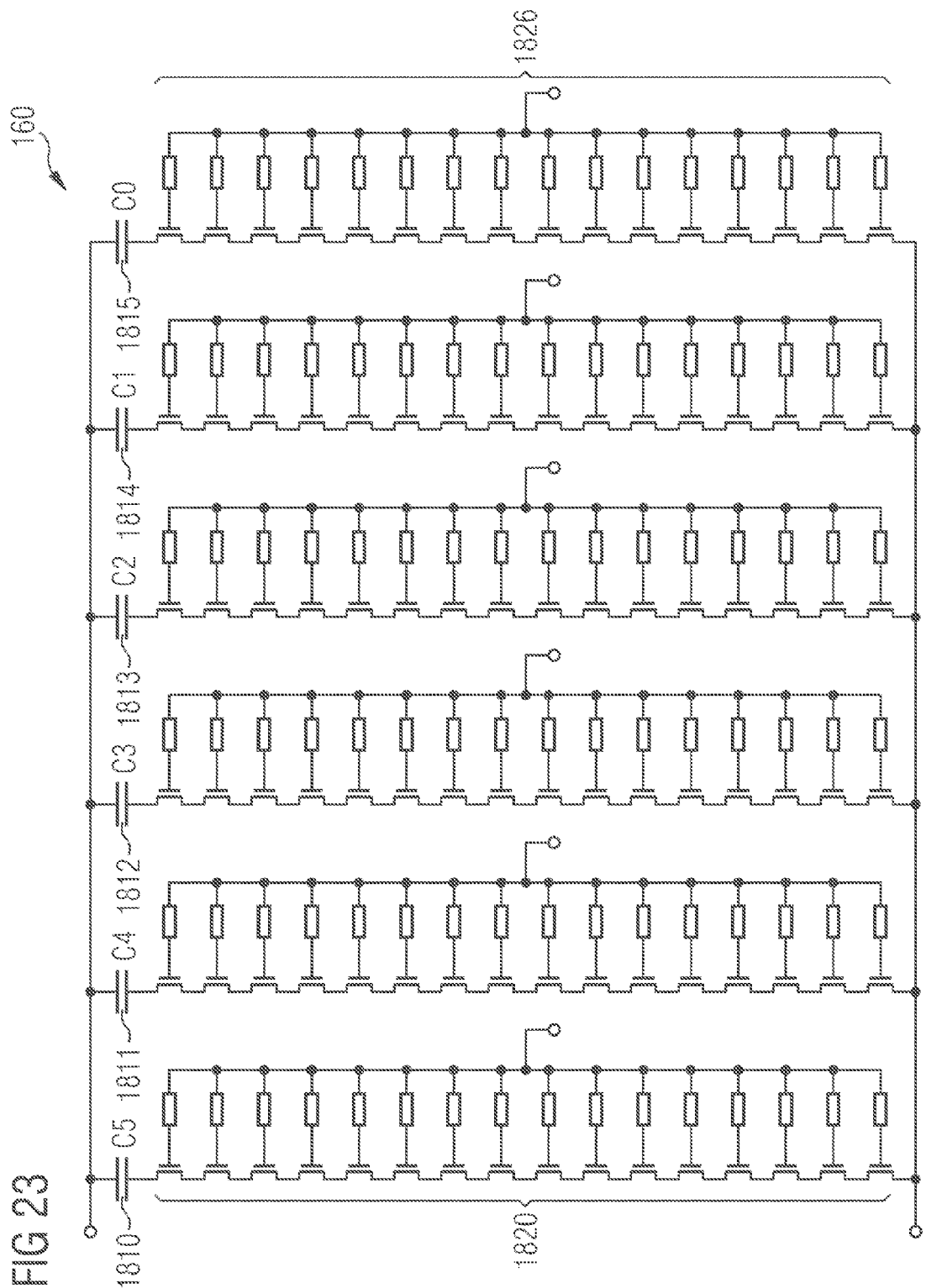
FIG. 23 shows a schematic circuit diagram of another implementation of a variable capacitive elements.

FIG. 23 shows a schematic circuit diagram of a variable capacitive element as an example. The variable capacitive element has a six bit resolution, 0.21 pF least significant bit, 6.74 pF most significant bit. The capacitance values for the six parallel branches are: 0.12 pF, 0.42 pF, 0.84 pF, 1.68 pF, 3.35 pF and 6.72 pF. Each switch element 1820 to 1826 is implemented as a 16-fold stacked CMOS switch for a maximal HF voltage of 24 V. The individual transistors are 3 mm transistors.

Figure 24:
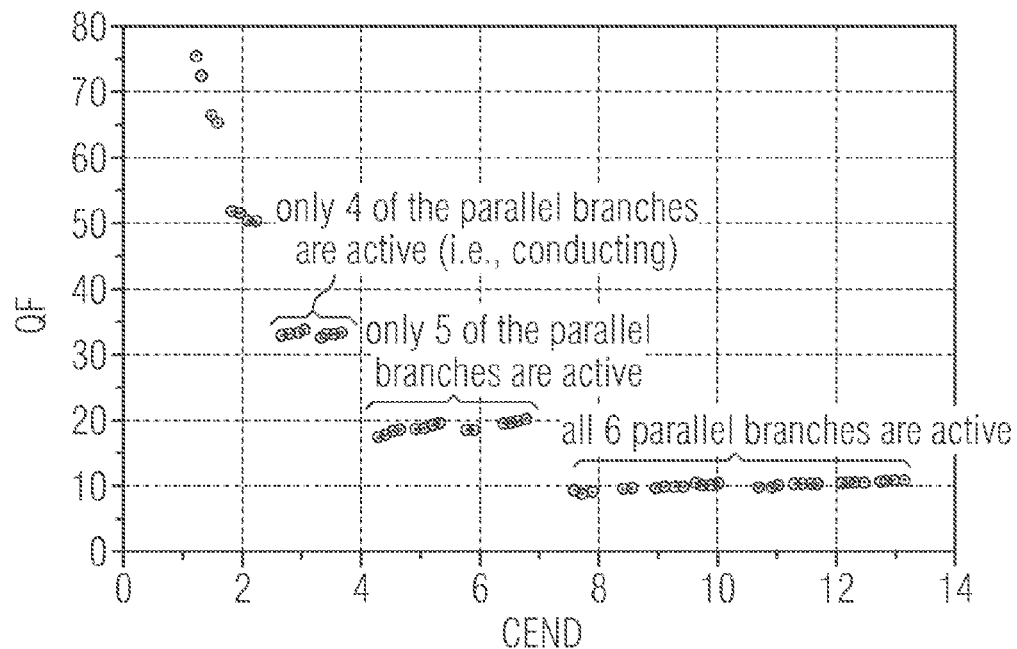
FIG. 24 illustrates the quality factor of the variable capacitive element in FIG. 23 as a function of the capacitance.

FIG. 24 shows a graph of the quality factor versus the overall capacitance CEND that can be achieved with the variable capacitive element 160 shown in FIG. 23. The highest quality factor of approximately 75 can be obtained for the smallest overall capacitance of approximately one unit (1 pF) in the scale of FIG. 24. For overall capacitive values between 7 pF and 13 pF, the quality factor is as low as 10. For high overall capacitance values all six parallel branches need to be conductive, which also makes the on-resistances $R_{on}$ of all the transistors to become apparent. For the range CEND=4 pF . . . 7 pF, only five of the six parallel branches need to be in the conducting state so that the overall on-resistance $R_{on}$ is smaller, which in turn leads to a higher quality factor of approximately 20. The real part is in the denominator of the quality factor, i.e., QF=|imaginary part/real part|. For this reason, the quality factor has by and large a hyperbolic dependency versus the overall capacitance CEND.

Figure 25:
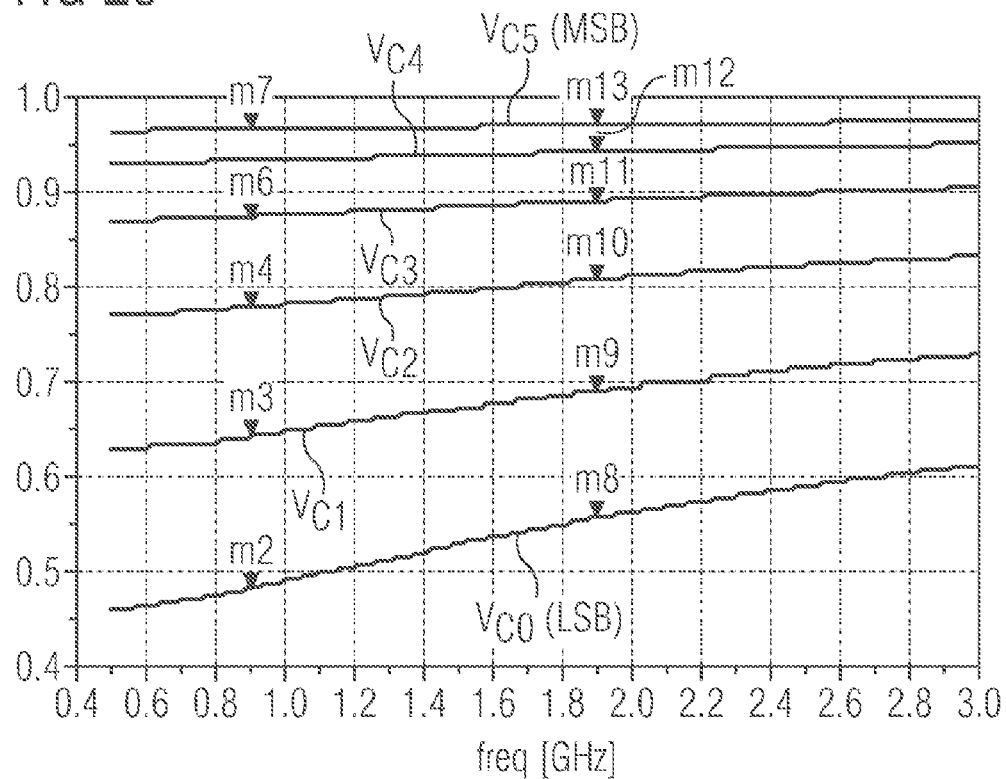
FIG. 25 graphically illustrates the voltage drops over the various series connections of transistors in the variable capacitive element in FIG. 23 as a function of frequency and for the worst case "all off"

Another important issue is the electric strength. The voltage swing or voltage spike splits up across the blocking transistors and the corresponding capacitor so that the maximal voltage swing at the transistor or the capacitor can be estimated in a simplified manner by means of an AC simulation. Such a simulation has been done using a normalized HF voltage (1 Volt) and the result is then multiplied with the corresponding voltage swing. For the variable capacitive element 160 shown in FIG. 23 the worst case would be the "all off" case and normalized to an input voltage of 1V voltage swings at the transistors would occur as illustrated in FIG. 25. VC0 is the voltage across the transistor corresponds to the smallest capacity C0, or at the least significant bit (LSB). VC5 is the voltage across the transistor that corresponds to the largest capacitive portion, or the most significant bit (MSB). It can be seen in FIG. 25 that with decreasing capacitance (towards the LSB) the voltage drop across the capacitor increases and that in exchange the corresponding transistor sees a lower voltage. As a consequence, the stacking for the small capacitances can be made smaller. For example, it appears reasonable in the contemplated case to stack only eight transistors instead of 16 transistors in the parallel branch corresponding to the LSB. This would economize on chip surface usage. In addition, a reduction of the width of the transistors can be implemented for smaller stacking, because of $R_{on}*C_{off}$.

When stacking several transistors, the following issues and possible trade-offs between them may have to be considered.

The maximal expected RF voltage typically decides on the number of transistors that need to be stacked.

A non-conducting transistor (transistor in the off-state; shunt/open ports) typically sees the worst voltage swing.

A higher number of stacked transistors typically increases the overall on-resistance $R_{on}$ of the transistor stack.

Dedicated (Tx, TRx, Rx) transistor dimensions typically improve the overall insertion loss.

A higher off-capacitance $C_{off}$ may mainly worsen the performance at high frequencies.

Wider transistors typically improve (i.e., reduce) the on-resistance $R_{on}$, but also increase the off-capacitance $C_{off}$.

Figure 26:
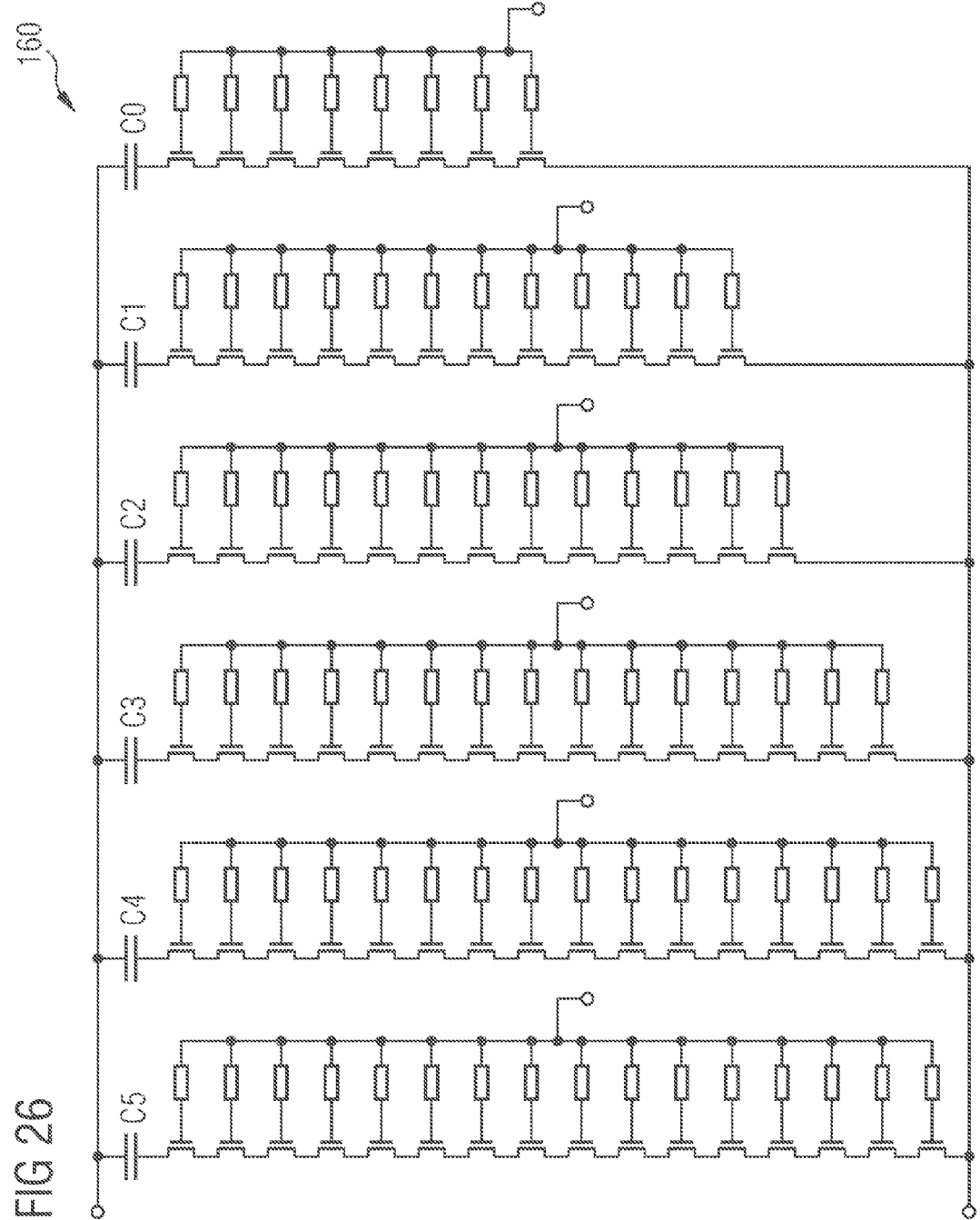
FIG. 26 shows a schematic circuit diagram of a variable capacitive element having different numbers of transistors in some of the branches according to a maximal expected voltage swing across the corresponding series connection of transistors.

FIG. 26 shows a schematic circuit diagram of the variable capacitive elements 160 according to a configuration in which the number of stacked transistors in each of the parallel branches takes into account the maximal voltage swing across the stacked transistors that has to be expected. Therefore, the transistor stack corresponding to capacitor C3 comprises 15 transistors only, instead of 16 transistors as before. The transistor stack corresponding to capacitor C2 comprises 13 transistors. The transistor stack corresponding to the capacitor C1 comprises 12 transistors. The transistor stack corresponding to the LSB capacitor C0 comprises only eight transistors.

Figure 27:
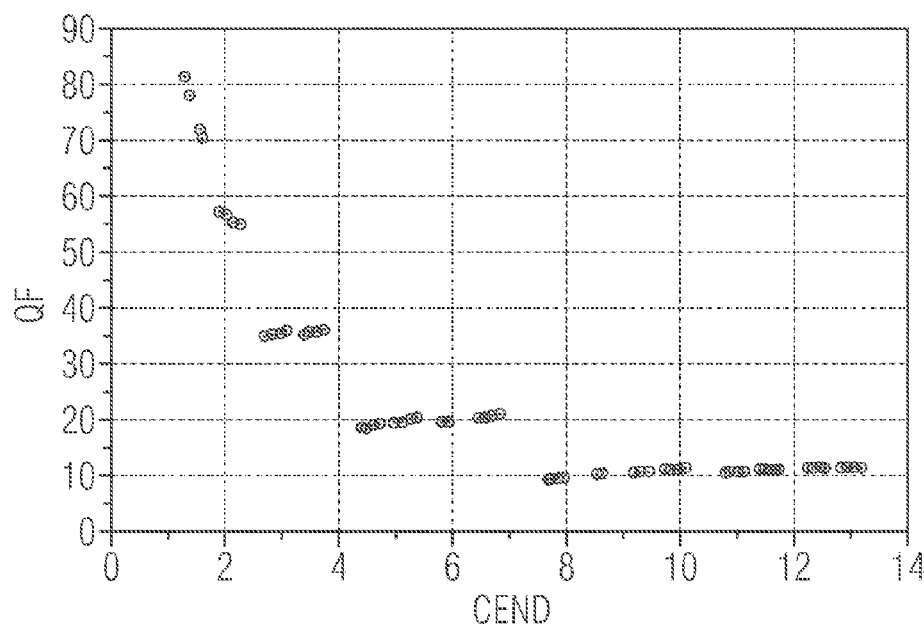
FIG. 27 shows a graph of the quality factor as a function of the variable capacitance of the variable capacitive elements shown in FIG. 26.

FIG. 27 shows a graph of the quality factor versus overall capacitance CEND of the variable capacitive element 160 having the configuration shown in FIG. 26. When comparing FIG. 27 to FIG. 24 it can be seen that the overall quality factor for small capacitances could be increased by using the configuration of FIG. 26. In particular in the region around 2 pF, the quality factor could be increased from Q=50 to Q=55.

It can also be seen that by varying the transistor width and MIM the maximum of the quality factor can be shifted.

Figure 28:
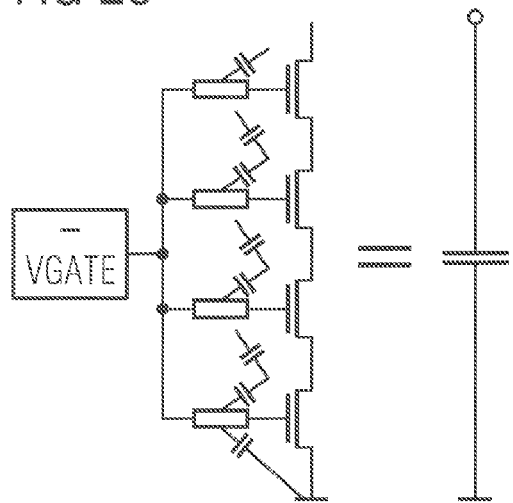
FIG. 28 schematically illustrates the electrical behavior of a variable capacitive element that exploits the off-capacitances of transistors when the transistors are non-conducting.
Figure 29:
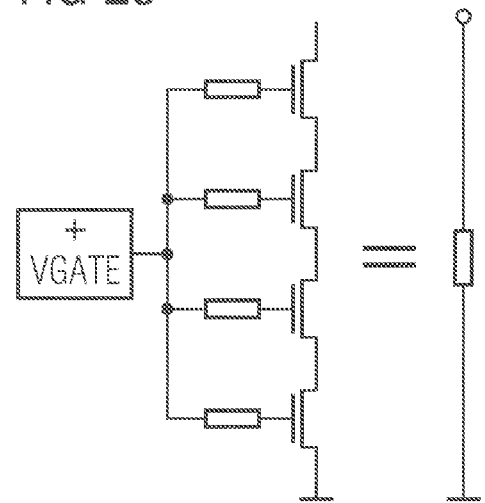
FIG. 29 schematically illustrates the electrical behavior of the variable capacitive element in which the off-capacitances of the transistors are combined to form the overall capacitance, when the transistors are conducting.

However, the capacitance is influenced substantially by the transistor (drain-source capacity $C_{DS}$ of CMOS transistor). Therefore, the capacitive element may be implemented entirely on the basis of one or more transistors (and no dedicated capacitor). This is schematically illustrated in FIGS. 28 and 29. FIG. 28 illustrates the variable capacitive element 160 when all transistors are in a non-conductive state. In the "all off" case (all transistors are non-conductive), the series connection of the four transistors behaves as a capacity with $1/C_{overall}=4/C_{DS}$, according to the formula for series-connected capacities.

FIG. 29 schematically illustrates the case in which all transistors are in the conducting state so that the series connection of the four transistors substantially behaves as a resistance with $R_{overall}=4\,R_{on}$. In FIG. 28 the gate voltage for the transistors is negative, as indicated by the symbol "−VGATE." In FIG. 29 the gate voltage for the transistors is positive, as indicated by the symbol "+VGATE."

Figure 30:
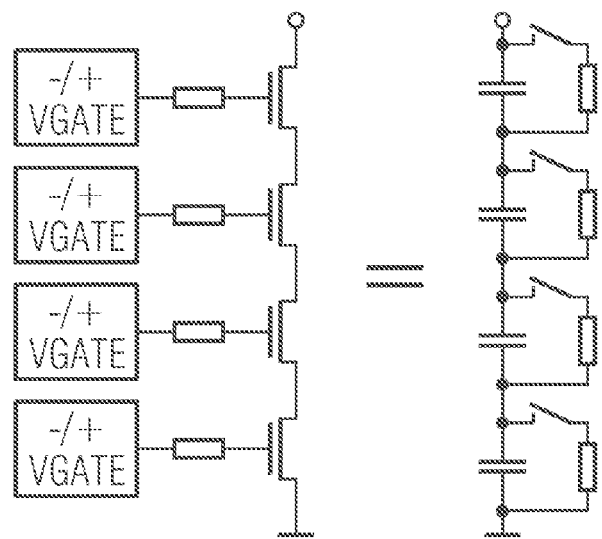
FIG. 30 schematically illustrates the electrical behavior of a variable capacitive element based on transistor-capacitances when the transistors are non-conducting.

Combining FIGS. 28 and 29 leads to a variable capacitive element as schematically illustrated in FIG. 30. Each transistor is individually controllable by a negative or a positive gate voltage −/+VGATE. Each transistor may be represented by a parallel connection of a capacitor (corresponding to the off-capacitance $C_{off}$) and a resistor with a switch. In other words, a series-connection of the capacities allows adjustment of the overall capacitance depending on the bit pattern.

Figure 31:
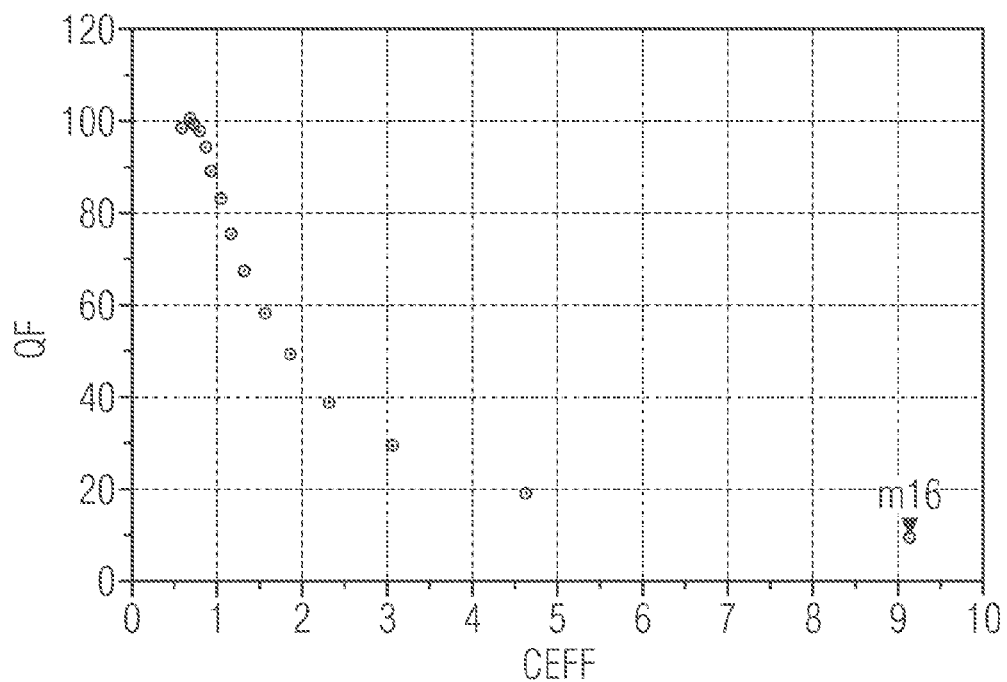
FIG. 31 shows a graph of the quality factor versus effective capacitance for 16 series-connected transistors in 130 nm technology.

FIG. 31 shows an example of the quality factor versus the overall capacitance for 16 transistors in 130 nm technology. Note that one point is missing from the graph of FIG. 31: when all transistors are closed (i.e., conducting), a pass-through "C∞" is obtained. In this case the quality factor would be very high again. Furthermore, it can be seen that at small capacitance values a very fine adjustability is provided. The fine adjustability can be spread apart by switching several transistors at the same time (concurrently), when only a few transistors are conducting, or by enlarging the corresponding transistor widths.

The proposed variable capacitive elements do not necessarily require MIM capacities. Therefore, a more cost-effective process can be used. Furthermore, very high quality factors can be achieved for small capacitance values. The series-connected transistors have an inherent "through connection" functionality (i.e., a low-ohmic connection) without extra effort. This "through connection" causes, as it corresponds hypothetically to a C∞, only very small losses, because the transistor may be designed relatively large (typically, only a few ohms of series resistance). The reason for the transistor being relatively large is that in this manner a large off-capacitance $C_{off}$ can be obtained.

The proposed structure also has an advantage in the case of an electrostatic discharge (ESD), because large CMOS transistors have a self-protection function due to parasitic NPN transistors (p-bulk and n-channel). Typically, a MIM capacity supports pulses (voltage spikes) between 30 and 40 V, due to the thin dielectric, whereas a transistor can withstand voltages in the 1-2 KV range. The following relation between capacitance value C and electrical voltage directly favors the electric strength: large C→small voltage; small C→large voltage. Since a large capacitance corresponds to a small impedance or resistance Z, no large voltage swing can occur, that is, an excessive voltage or a voltage surge can be avoided concurrently, so that the transistor has to withstand a small voltage swing, only.

However, large transistors may be required in order to obtain the desired capacitance values. The series connection of several transistors is of particular interest, leaving relatively few possible combinations.

In case a SOI (silicon-on-isolator) process is provided, there is yet another possibility for making the capacity switchable, namely the body bias (see FIG. 10). According to a conventional approach used with SOI switches, the body is negatively biased, in order to avoid a creation of charges (=capacity) and to make the substrate diode inactive. However, when locally only small voltage swings can be observed, one may even tolerate a higher C(V). This means that it is possible to provide additional capacity, which admittedly is nonlinear, but in exchange becomes apparent in a relative modest manner only, due to the small HF voltage.

A similar technique can be used in connection with a triple-well transistor, as schematically illustrated in FIG. 9. Instead of placing the transistor within the bulk, it is possible to place each transistor in a triple well in order to make the bias voltage selectively switchable. By and large, the same effect as explained above for the SOI process can be achieved.

As mentioned above, another property of a transistor-based capacity relates to the ESD case. Whereas large transistors protect themselves using parasitic bipolar transistors (at least within the bulk CMOS), a series capacity typically is prone to ESD damage. In other words, without shunt coils the circuit would be very ESD sensitive.

With the proposed transistor-based capacity it may be possible to get along without a dedicated capacitor process (e.g., MIM process), if the transistor width is chosen to be sufficiently large.

FIGS. 32 to 37 illustrate several different matching cases for the circuit of FIG. 8 in a Smith chart representation and a graph of the forward transmission versus frequency. However the settings were done for 900 MHz.

Figure 32:
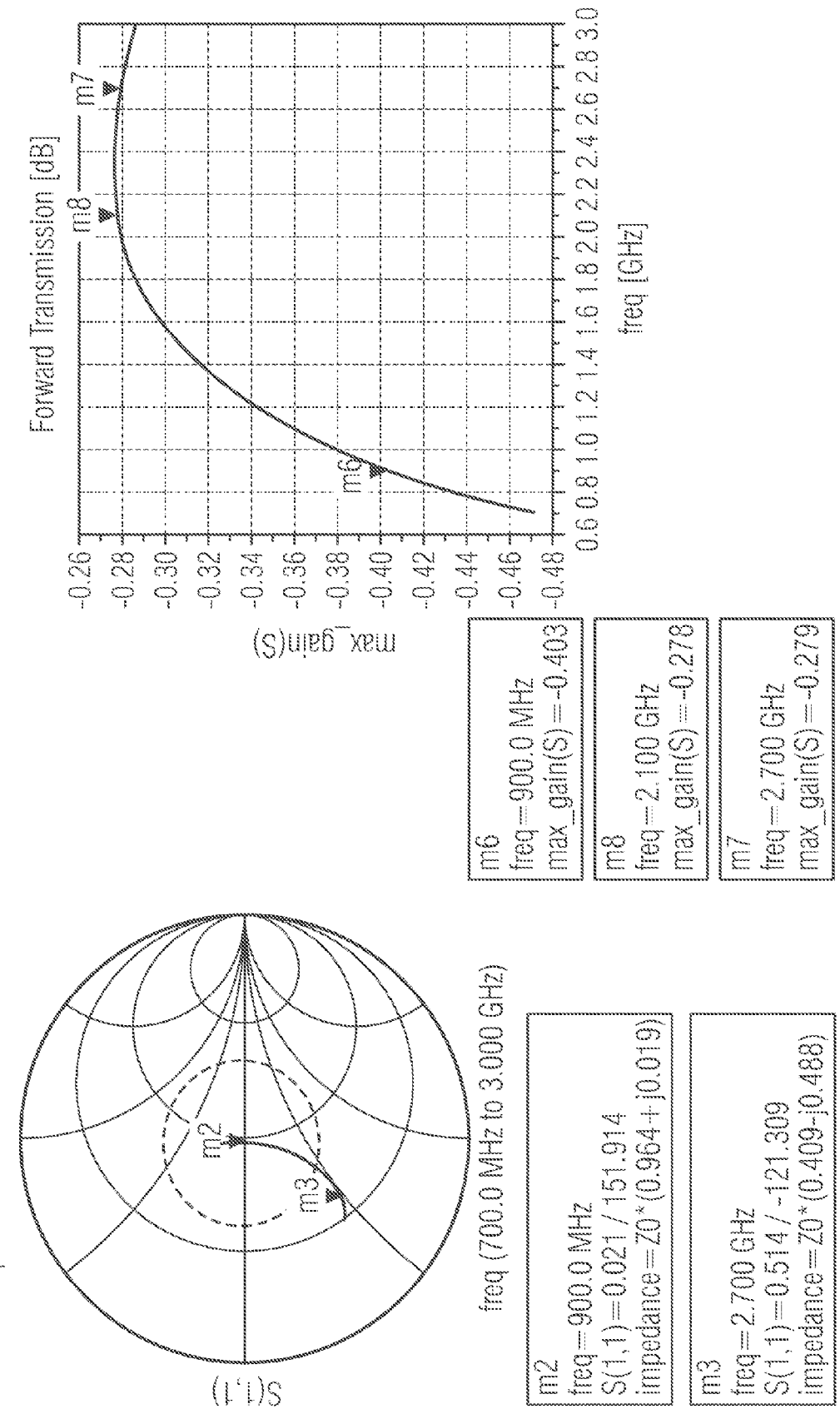

FIG. 32 illustrates the case in which a 50 ohm impedance shall be matched to 50 ohm. In other words, the impedances are already matched and the impedance matching circuit is supposed to act as a phase shifter, only. For this purpose, all series transistors of the variable series capacitive element 260 are switched on and the transistors of the variable shunt capacitive elements 160, 360 operate all in their respective off-states, to obtain a minimum $C_{off}$. Furthermore the L switch is set to the maximal inductance. As a result, we see the insertion loss of the series variable capacitive element 260 and the $C_{off}$ capacitive behavior of the variable capacitive elements 160 and 360.

FIG. 33 illustrates the case of a high inductive impedance. Here, the series capacitance 260 is active for a high value and the inductance bank 110 is set to a reduced inductance. The variable capacitive elements 160 and 260 stay in minimal $C_{off}$ mode.

Figure 34:
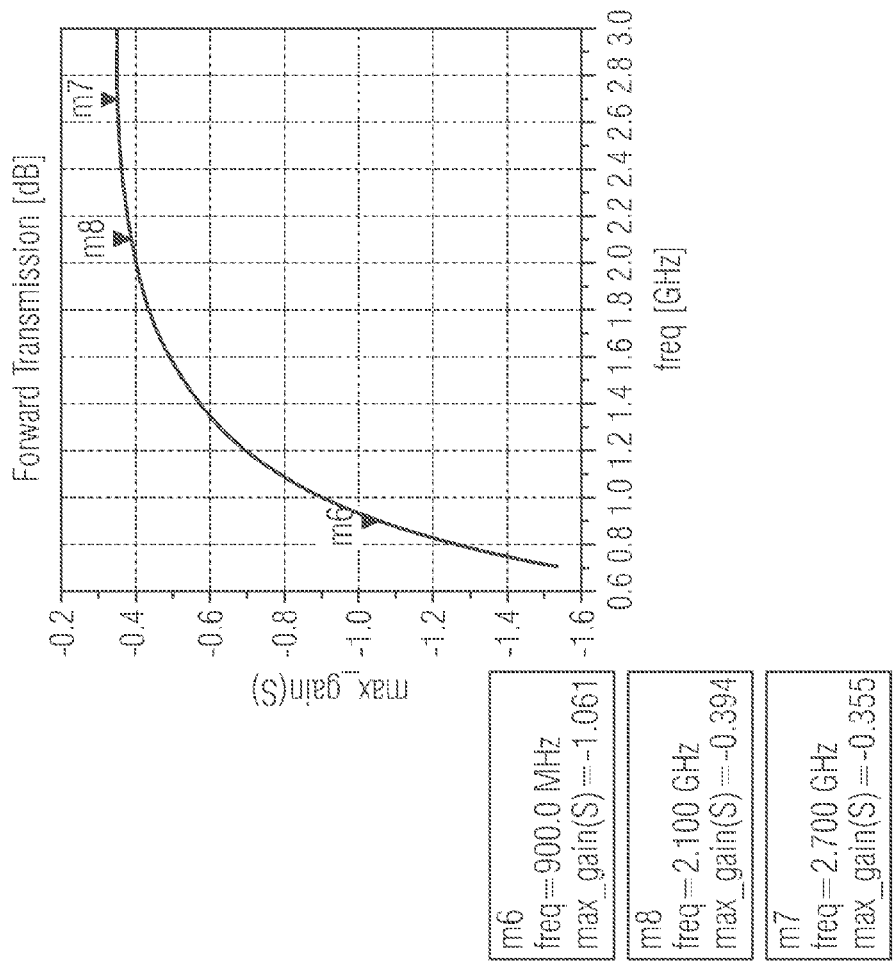

FIG. 34 illustrates the case of a mostly real-valued, high impedance. This is done by setting the variable series capacitive element 260 to a very low capacitance, as well as the variable capacitive elements 160 and 360. The inductance bank 110 is set to a high inductance.

FIG. 35 illustrates the case of a low-ohmic inductive impedance. The inductance bank 110 is set here to a low inductance (~3 nH) while a low series capacitance 260 is used.

Figure 36:
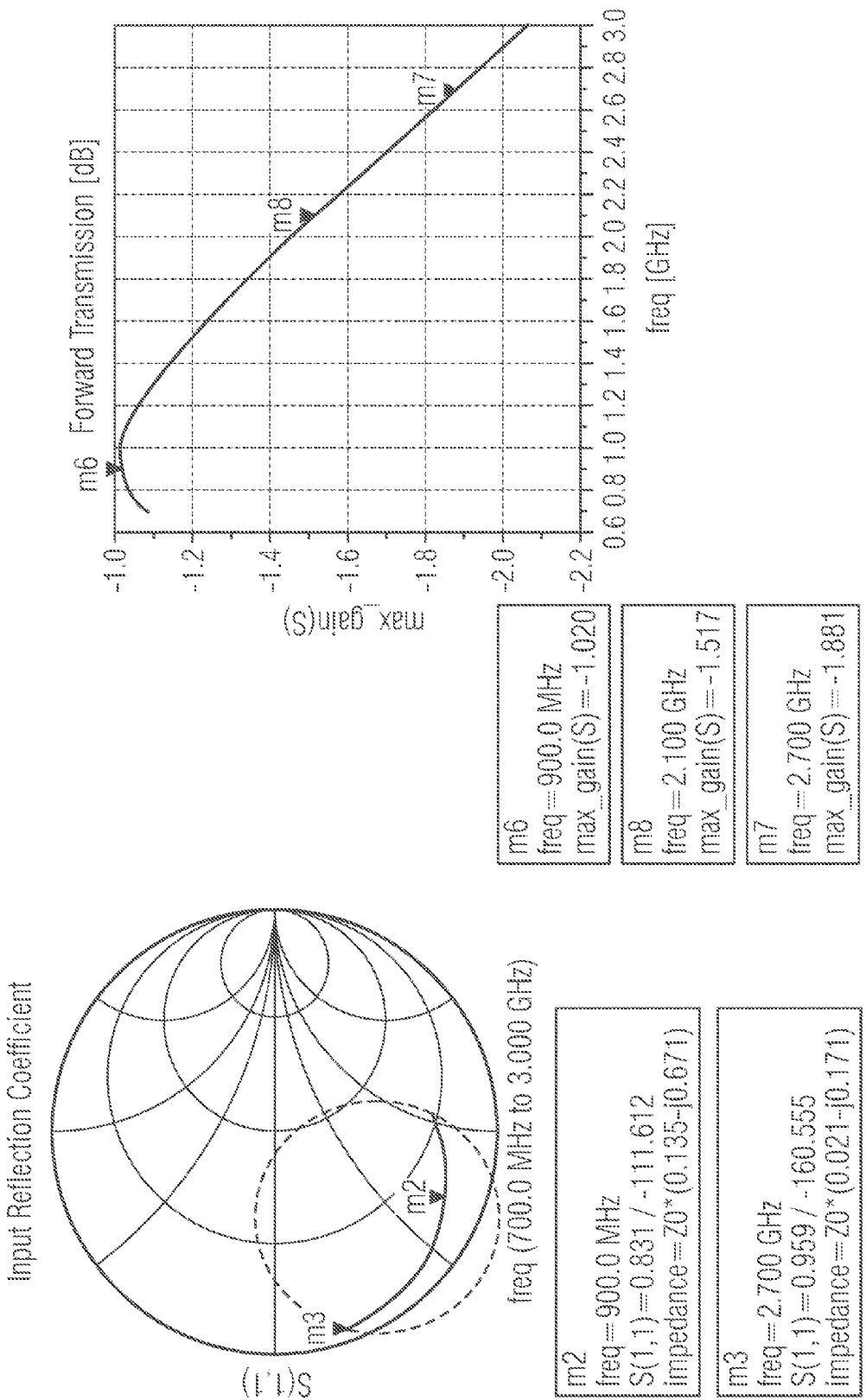

FIG. 36 illustrates the case of a low-ohmic capacitive impedance. Using the variable series capacitive element 260 in a higher capacitance area and setting variable capacitive elements 160 and 360 to high capacitance as well, the indicated area in the Smith chart can be considered.

Figure 37:
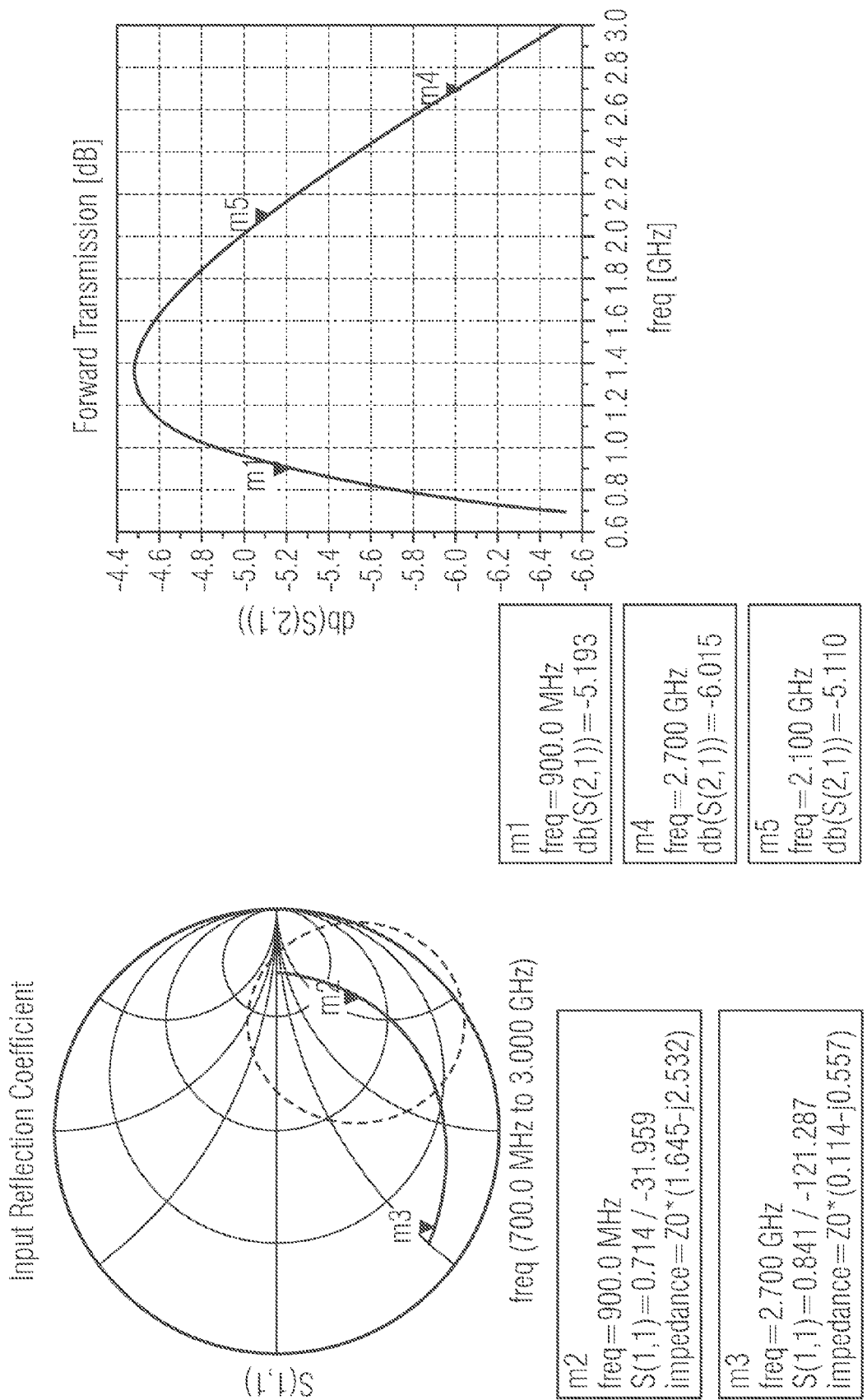

FIG. 37 illustrates the case of a high-ohmic capacitive impedance. Here variable series capacitive element 260 is set to about 1 pF and variable capacitive element 160 to a low capacitance.

The examples FIGS. 32 to 37 have been simulated using an integrated planar coil. It is estimated that wire-wound SMD coils with high quality factor would further improve the result.

The width of the MOS transistors can be weighted in order to better reach a desired target capacitance. Instead of always switching just one transistor in the series connection, combinations thereof may be switched concurrently, in order to save control bits. For example, there may be 16 control bits but 18 transistors. In this case, the first three transistors could always be switched concurrently, whereas the remaining 15 transistors are controllable in an individual manner. Using logical circuits, an intermediary decoder may be considered, as well, that translates the 16 states to four bits. In this manner, a shorter control signal can be achieved.

Figure 38:
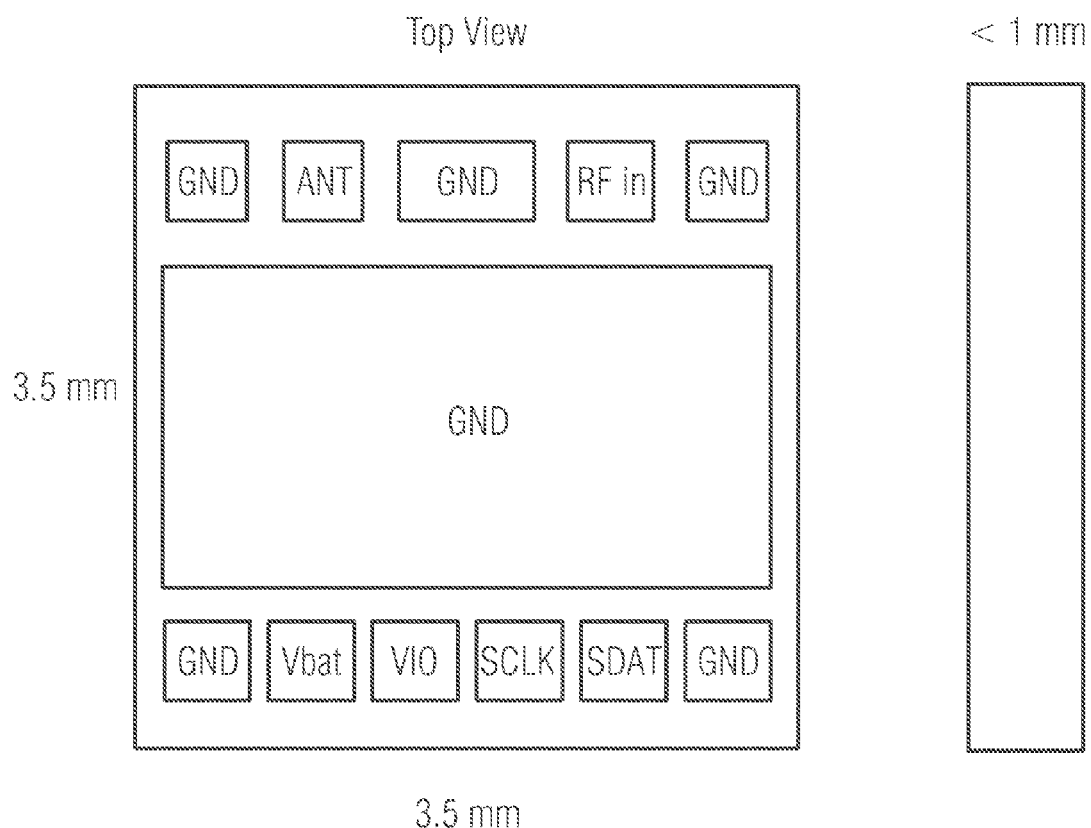
FIG. 38 shows a schematic top view of a pin layout and a schematic side view of an integrated impedance matching network according to embodiments.

FIG. 38 shows a schematic top view and a schematic side view of an integrated circuit comprising an impedance matching network as described above. In the top view of FIG. 38, a proposed pin layout of the integrated circuit can be seen. The different abbreviations are:

GND: ground (e.g., connected internally to the reference potential terminal 16)
ANT: antenna (e.g., connected internally to the second signal terminal 14)
RF in: radiofrequency in (e.g., connected internally to the first signal terminal 12)
VBAT: supply voltage
VIO: input/output voltage
SCLK: serial clock
SDAT: serial data The integrated circuit may be implemented as a 3.5 mm×3.5 mm laminate module. Of course, other sizes are also possible. The laminate module may comprise a barium titanate laminate (BT laminate) for the variable capacitive elements (can be left out).

Figure 39:
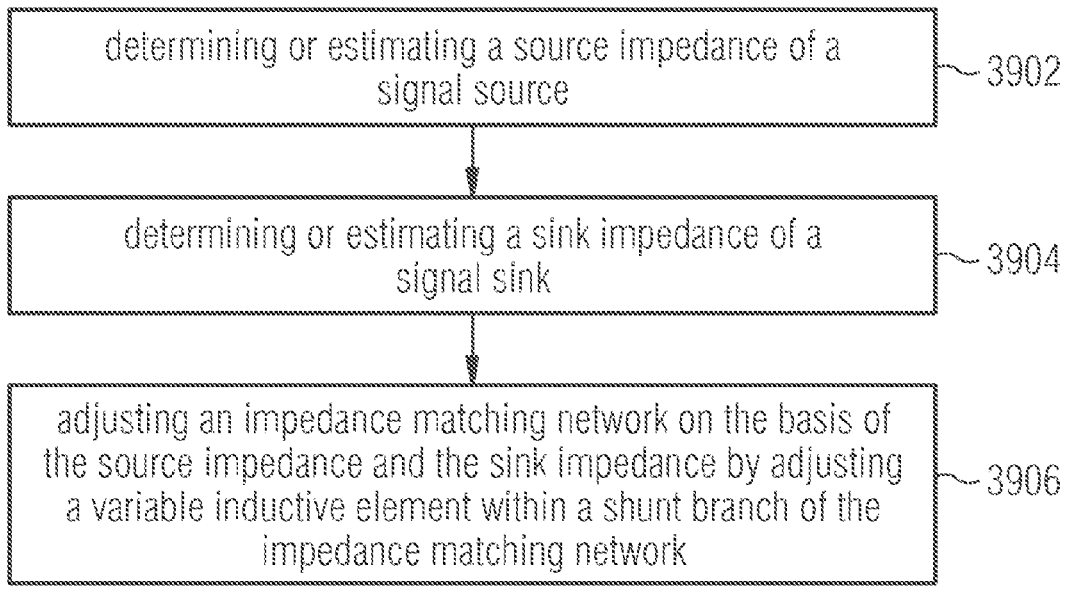
FIG. 39 shows a schematic flow diagram of a method for impedance matching according to embodiments.

FIG. 39 shows a schematic flow diagram of a method for matching impedances. The method comprises a step 3902 of determining or estimating a source impedance of a signal source. The method also comprises a step 3904 of determining or estimating a sink impedance of a signal sink. At a step 3906 an impedance matching network is adjusted on the basis of the source impedance and the sink impedance. Adjusting the impedance matching network is performed by adjusting a variable inductive element that is provided within a shunt branch of the impedance matching network.

Adjusting the variable inductive element may comprise switching on or off at least one transistor resulting in a corresponding inductive portion of the variable conductive element being connected or not connected to a signal terminal of the impedance matching network.

Adjusting the impedance matching network may further comprise adjusting a variable capacitive element within a series branch of the impedance matching network.

Figure 40:
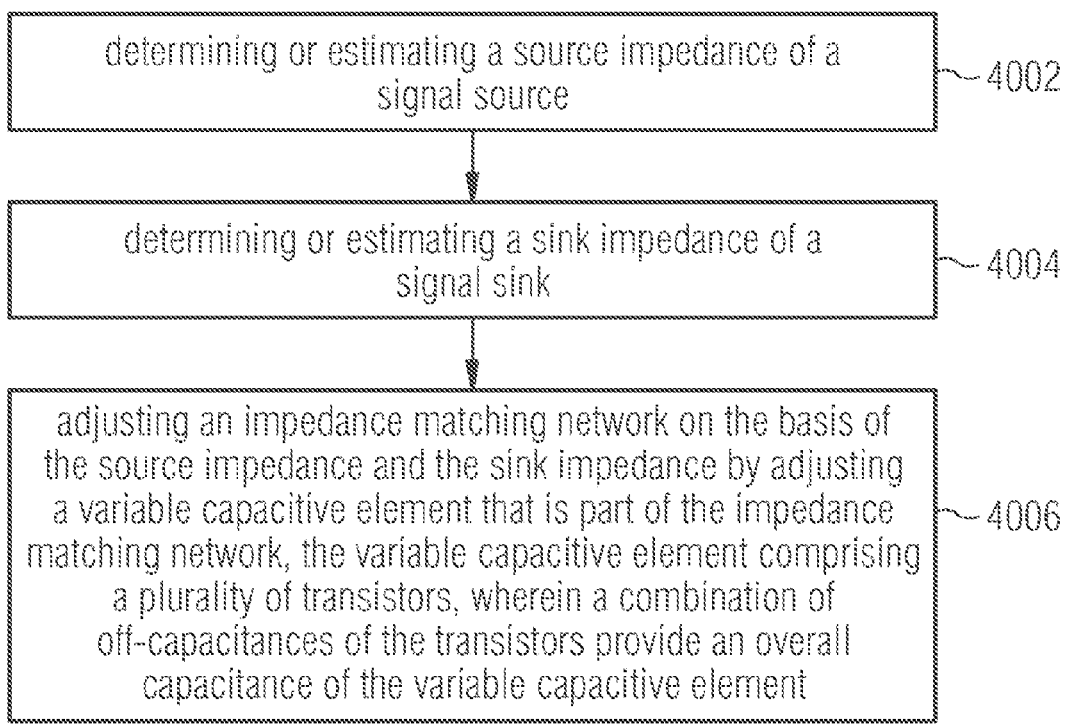
FIG. 40 shows a schematic flow diagram of a method for impedance matching according to further embodiments.

FIG. 40 shows a schematic flow diagram of a method for matching impedances according to other embodiments. The method comprises a step 4002 of determining or estimating a source impedance of a signal source. The method further comprises a step 4004 of determining or estimating a sink impedance of a signal sink. At a step 4006 of the method for matching an impedance, an impedance matching network is adjusted on the basis of the source impedance and the sink impedance. In particular, a variable capacitive element that is part of the impedance matching network is adjusted. The variable capacitive element comprises a plurality of transistors, wherein a combination of off-capacitances $C_{off}$ of the transistors provide an overall capacitance of the variable capacitive element.

Figure 41:
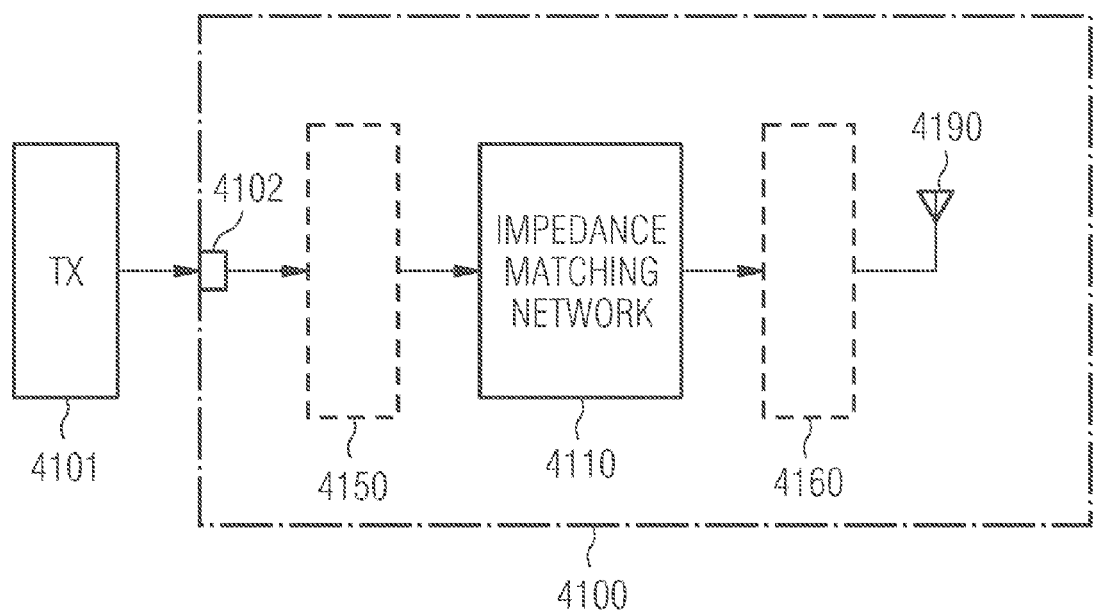
FIG. 41 shows a schematic block diagram of an antenna circuit comprising an impedance matching network.

FIG. 41 shows a schematic block diagram of an antenna circuit 4100 comprising an impedance matching network 4110 as described above. The antenna circuit may be part of a mobile communications device, for example a mobile phone, a smart phone, a tablet computer, an USB wireless modem, a base transceiver station, a wireless access point (WLAN, WiFi, etc.), a wireless router, and other similar products.

The antenna circuit 4100 comprises an antenna 4190 and a signal terminal 4102 configured to relay a signal received from a transmitter 4101. The signal terminal 4102 receives the signal from the transmitter and forwards, or distributes, it within the antenna circuit 4100 to further components of the antenna circuit. Instead of the transmitter 4101, the antenna circuit could be connected to a receiver (not shown in FIG. 41)

in which case the signal terminal 4102 would be configured to forward the signal to the receiver for further processing. Yet another option is that the antenna circuit 4100 is connected to a transceiver.

The antenna circuit 4100 further comprises an impedance matching network 4110 interconnecting the antenna 4190 and the signal terminal 4102. The impedance matching network comprises a variable inductive element within a shunt branch, as explained above. In addition to the impedance matching network 4110, the antenna circuit may comprise further optional components 4150 and/or 4160 that are interconnected between the signal terminal 4102 and the impedance matching network and/or between the impedance matching network 4110 and the antenna 4190. These additional components 4150, 4160 may be, for example, an antenna switch, a harmonic filter, and/or a power amplifier.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such substeps may be included and part of the disclosure of this single step unless explicitly excluded.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. An impedance matching network comprising:
a first signal terminal, a second signal terminal, and a reference potential terminal;
a first shunt branch between the first signal terminal and the reference potential terminal, the first shunt branch comprising a parallel circuit of a variable inductive element and a first capacitive element;
a second shunt branch between the second signal terminal and the reference potential terminal and comprising a second capacitive element; and
a series branch between the first signal terminal and the second signal terminal, the series branch comprising a third capacitive element, wherein the variable inductive element comprises a first inductive portion, a second inductive portion, and a switch element configured to selectively connect at least one of the first inductive portion and the second inductive portion between the first signal terminal and the reference potential terminal,
wherein at least one of the first capacitive element, the second capacitive element, and the third capacitive element is a variable capacitive element, and
wherein the variable capacitive element comprises a transistor, wherein an off-capacitance $C_{off}$ of the transistor serves as a high capacitance value of the variable capacitive element, and wherein the variable capacitive element has a low capacitance value when the transistor is in a conducting state.

2. The impedance matching network according to claim 1, wherein the variable capacitive element comprises at least two parallel branches, each parallel branch comprising a switch element, and wherein at least one parallel branch further comprises a capacitor connected in series with the corresponding switch element.

3. The impedance matching network according to claim 2, wherein the switch elements within the at least two parallel branches are implemented as a series connection of a plurality of transistors.

4. The impedance matching network according to claim 3, wherein the number of series connected transistors is different in at least two of the parallel branches.

5. The impedance matching network according to claim 2, wherein at least two parallel branches comprise capacitors having different capacitances.

6. The impedance matching network according to claim 1, wherein the off-capacitances of the transistors serve to provide different capacitance values of the variable capacitive element as a function of a plurality of independent control signals for the plurality of transistors.

7. The impedance matching network according to claim 6, wherein at least two transistors of the plurality of transistors have different sizes.

8. The impedance matching network according to claim 1, wherein the variable inductive element comprises at least two parallel branches, each parallel branch comprising an inductive portion, and wherein at least one parallel branch further comprises a switch element connected in series with the corresponding inductive portion.

9. The impedance matching network according to claim 1, wherein the variable inductive element comprises a series connection of at least two inductive portions and a switch element connected in parallel to a bypassable inductive portion of the at least two inductive portions, the switch element being configured to selectively bypass the bypassable inductive portion.

10. The impedance matching network according to claim 1, wherein the variable inductive element is an integrated circuit or a portion of an integrated circuit.

11. The impedance matching network according to claim 1, wherein the second shunt branch comprises a second variable inductive element.

12. The impedance matching network according to claim 1, wherein the third capacitive element is one of an on-chip capacity, a metal-insulator-metal capacitor, and a surface-mounted device.

13. The impedance matching network according to claim 1, wherein the series branch has a quality factor of at least 30 over an operative frequency range of the impedance matching network.

14. An impedance matching network comprising a variable capacitive element, the variable capacitive element comprising a plurality of transistors, wherein a combination of off-capacitances $C_{off}$ of the transistors provide an overall capacitance of the variable capacitive element as a function of at least two independent transistor control signals.

15. The impedance matching network according to claim 14, further comprising a first shunt branch between a first signal terminal and a reference potential terminal;

a second shunt branch between a second signal terminal and the reference potential terminal; and a series branch between the first signal terminal and the second signal terminal;

wherein one of the first shunt branch, the second shunt branch, and the series branch comprises the variable capacitive element.

16. The impedance matching network according to claim 15, wherein one of the first shunt branch and the second shunt branch comprises a variable inductive element; and wherein the series branch comprises a capacitive element.

17. The impedance matching network according to claim 14, wherein the plurality of transistors are series connected.

18. The impedance matching network according to claim 14, wherein at least two of the plurality of transistors have a different size.

* * * * *